United States Patent
Long et al.

(10) Patent No.: US 12,218,256 B1
(45) Date of Patent: Feb. 4, 2025

(54) TRENCH MOS RECTIFIER WITH TERMINATION STRUCTURE

(71) Applicant: Diodes Incorporated, Plano, TX (US)

(72) Inventors: Tao Long, Shanghai (CN); Ze Rui Chen, Plano, TX (US); Pin-Hao Huang, New Taipei (TW); Bau-Shun Huang, New Taipei (TW); Lee Spencer Riley, Lancashire (GB)

(73) Assignee: DIODES INCORPORATED, Plano, TX (US)

( * ) Notice: Subject to any disclaimer, the term of this patent is extended or adjusted under 35 U.S.C. 154(b) by 0 days.

(21) Appl. No.: 18/774,563

(22) Filed: Jul. 16, 2024

(30) Foreign Application Priority Data

Nov. 2, 2023 (CN) .......................... 202311450972.6

(51) Int. Cl.
   *H01L 29/872* (2006.01)
   *H01L 23/58* (2006.01)
   *H01L 27/102* (2023.01)
   *H01L 29/06* (2006.01)
   *H01L 29/66* (2006.01)

(52) U.S. Cl.
   CPC ........ *H01L 29/8725* (2013.01); *H01L 23/585* (2013.01); *H01L 27/1021* (2013.01); *H01L 29/0623* (2013.01); *H01L 29/66143* (2013.01)

(58) Field of Classification Search
   CPC .................. H01L 29/8725; H01L 29/0623
   See application file for complete search history.

(56) References Cited

U.S. PATENT DOCUMENTS

| | | | | |
|---|---|---|---|---|
| 6,031,265 A | * | 2/2000 | Hshieh | H01L 29/42372 257/334 |
| 7,453,119 B2 | * | 11/2008 | Bhalla | H01L 29/7811 257/E29.066 |
| 8,120,100 B2 | * | 2/2012 | Lin | H01L 29/66727 257/341 |
| 8,692,322 B2 | * | 4/2014 | Pan | H01L 29/407 257/334 |
| 2005/0073030 A1 | * | 4/2005 | Inoue | H01L 29/861 257/656 |

(Continued)

FOREIGN PATENT DOCUMENTS

TW   I358130 B   2/2012

*Primary Examiner* — Evren Seven
(74) *Attorney, Agent, or Firm* — Kilpatrick Townsend & Stockton LLP

(57) ABSTRACT

A semiconductor structure includes: a substrate, having a cell region and a terminal region, and having a first surface, a second located in the terminal region, and a third surface located in the cell region, the second surface and the third surface being located at different levels; a first trench structure, located in the cell region, traversing the third surface to extend towards the first surface, including a first semiconductor material layer and a first oxide layer partially protruding from the third surface, and extending in a first direction parallel to the third surface; and a second trench structure, located in the cell region, including a second semiconductor material layer and a second oxide layer partially protruding from the third surface, and extending parallel to the first direction, wherein the third surface is provided with a doped region between the first trench structure and the second trench structure.

7 Claims, 25 Drawing Sheets

(56) References Cited

U.S. PATENT DOCUMENTS

2006/0209887 A1* 9/2006 Bhalla ................ H01L 29/7811
　　　　　　　　　　　　　　　　　　　　　257/E29.066
2007/0034901 A1* 2/2007 Lui .................... H01L 29/66143
　　　　　　　　　　　　　　　　　　　　　257/E29.066
2021/0210625 A1　7/2021 Sadovnikov et al.

* cited by examiner

TRENCH MOS RECTIFIER WITH TERMINATION STRUCTURE

CROSS-REFERENCES TO RELATED APPLICATIONS

The present application claims priority to Chinese Patent Application No. 202311450972.6, filed on Nov. 2, 2023 and entitled "A NEW TRENCH MOS RECTIFIER WITH TERMINATION STRUCTURE", the disclosure of which is hereby incorporated by reference in its entirety.

TECHNICAL FIELD

The present invention relates to a semiconductor structure and a manufacturing method therefor, and more specifically, to a rectifier device of a trench metal oxide semiconductor (MOS) structure and a manufacturing method therefor.

BACKGROUND OF THE INVENTION

Modern power circuits need to have high power, low loss, and fast switching rectifiers. For high voltage applications, P-N junction gate rectifiers having high switching speeds are often employed when high breakdown voltages and high operating temperatures are required. For low voltage applications, Schottky barrier rectifiers are often employed when high switching speeds and very low forward bias are required. A Schottky barrier rectifier is a majority carrier device that uses a metal oxide semiconductor (MOS) process and allows only a small reverse leakage current to flow during a recovery process. Unfortunately, Schottky barrier rectifiers suffer from undesirably high reverse leakage currents when operating at raised temperatures.

Currently, some improvement measures are taken to improve the blocking capabilities of Schottky rectifiers. One such improvement method is the use of a junction barrier Schottky (JBS) rectifier which combines a P/N junction gate with a sufficiently small Schottky barrier region to extend the space charge region from the P-N junction gate, thereby eliminating degradation of the Schottky barrier caused by image charge.

Another such improvement method is the use of a Schottky barrier diode (SBD), which has a lower forward bias, which is beneficial for forward power loss. However, the SBD also has a high reverse leakage current, resulting in a high reverse power loss, which becomes the technical bottleneck of such apparatuses.

Therefore, further improvements to the rectifier devices in the prior art are needed to achieve more ideal high power and low loss, so as to be adaptable to fast switching applications.

SUMMARY OF THE INVENTION

Embodiments of the present disclosure relate to a semiconductor structure. The semiconductor structure comprises: a substrate, on which a cell region and a terminal region adjacent to the cell region seen in a plan view are defined, the substrate having a first surface, a second surface opposite the first surface and located in the terminal region, and a third surface opposite the first surface and located in the cell region, and the second surface and the third surface being adjacent to each other and located at different levels; a first trench structure, located in the cell region and traversing the third surface to extend towards the first surface, wherein the first trench structure comprises a first semiconductor material layer at least partially protruding from the third surface and a first oxide layer surrounding the first semiconductor material layer, and the first trench structure extends in a first direction parallel to the third surface; and a second trench structure, located in the cell region and traversing the third surface to extend towards the first surface, wherein the second trench structure comprises a second semiconductor material layer at least partially protruding from the third surface and a second oxide layer surrounding the second semiconductor material layer, and the second trench structure extends parallel to the first direction, wherein the third surface of the substrate is provided with a first doped region, and when seen in a plan view, the first doped region is provided between the first trench structure and the second trench structure, and extends in a second direction parallel to the third surface and perpendicular to the first direction.

Embodiments of the present disclosure relate to a manufacturing method for a semiconductor structure. The method comprises: forming, at intervals on a substrate in a first direction, a first trench, a second trench, and a third trench extending from a second surface towards a first surface opposite the second surface, wherein a cell region and a terminal region seen in a plan view are defined on the substrate, the first trench and the second trench being provided in the cell region, and the third trench being provided in the terminal region; forming a first oxide layer in the first trench, forming a second oxide layer in the second trench, and forming a third oxide layer in the third trench; forming a first semiconductor material layer in the first trench to cause the first semiconductor material layer to be surrounded by the first oxide layer to form a first trench structure, forming a second semiconductor material layer in the second trench to cause the second semiconductor material layer to be surrounded by the second oxide layer to form a second trench structure, and forming a third semiconductor material layer in the third trench to cause the third semiconductor material layer to be surrounded by the third oxide layer to form a third trench structure; forming a mask layer on the cell region, the first trench structure, and the second trench structure; performing a first etching process on the mask layer to form a first opening and a second opening, the first opening extending in the first direction such that at least part of the first semiconductor material layer is exposed, and the second opening extending in a second direction perpendicular to the first direction such that at least part of the second surface and the first trench structure are exposed; after the first etching process, performing a second etching process at the second opening to form a third surface on the substrate and to cause the first trench structure and the second trench structure to at least partially protrude from the third surface of the cell region; and forming a first doped region adjacent to the third surface exposed by the second opening, wherein when seen in a plan view, the first doped region is provided between the first trench structure and the second trench structure, and extends in the second direction.

In some embodiments, the width of the first trench structure and the width of the third trench structure are substantially the same. In some embodiments, the depth of the first trench structure and the depth of the third trench structure are substantially the same. In some embodiments, top surfaces of the first trench structure, the second trench structure, and the third trench structure are coplanar. In some embodiments, top surfaces of the first trench structure and the second trench structure and the second surface are coplanar.

BRIEF DESCRIPTION OF THE DRAWINGS

When the following detailed description is read with reference to the accompanying drawings, aspects of several embodiments of the present disclosure may be best understood. It should be noted that various structures may not be drawn to scale. Indeed, for clarity of discussion, the dimensions of the various structures can be arbitrarily enlarged or reduced.

Figure 1:
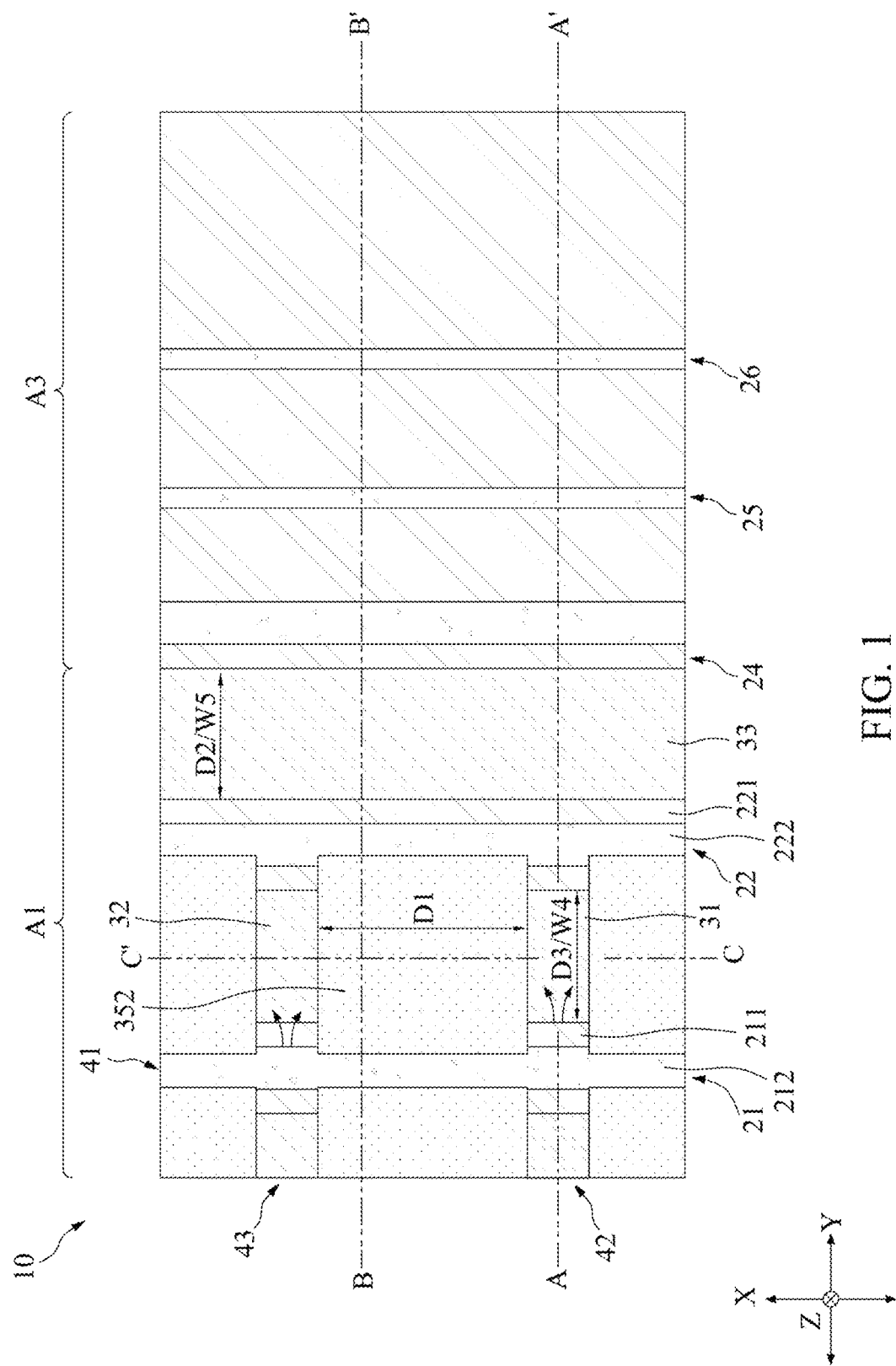
FIG. 1 shows a plan view of a semiconductor structure according to some embodiments of the present disclosure.

The same or similar components are denoted with the same reference signs in the drawings and detailed description. Several embodiments of the present disclosure will be immediately understood from the following detailed description with reference to the accompanying drawings.

DETAILED DESCRIPTION OF THE INVENTION

The following disclosure provides numerous different embodiments or examples for implementing different features of the presented subject matter. Specific examples of components and configurations will be described below. Of course, these are merely examples and are not intended to be limiting. In the present disclosure, the reference to forming a first feature above or on a second feature may include an embodiment in which the first feature and the second feature are formed in direct contact, and may further include an embodiment in which another feature may be formed between the first feature and the second feature such that the first feature and the second feature may not be in direct contact. Moreover, reference numerals and/or letters may be repeated in various examples of the present disclosure. This repetition is for simplicity and clarity and itself does not indicate the relationship between various embodiments and/or configurations discussed.

The embodiments of the present disclosure will be discussed in detail below. However, it should be understood that the present disclosure provides a number of applicable concepts that can be embodied in a wide variety of particular environments. The specific embodiments discussed are merely illustrative and do not limit the scope of the present disclosure.

Provided in the present disclosure are a semiconductor structure and a manufacturing method therefor. In the semiconductor structure of the present disclosure, the direction of extension of a channel is perpendicular to the direction of extension of a trench structure, and the size of a pitch of the channel may be adjusted according to a process capability, so that channel density can be increased, thereby increasing current density, improving electric field uniformity, and reducing a reverse leakage current.

Figure 2:
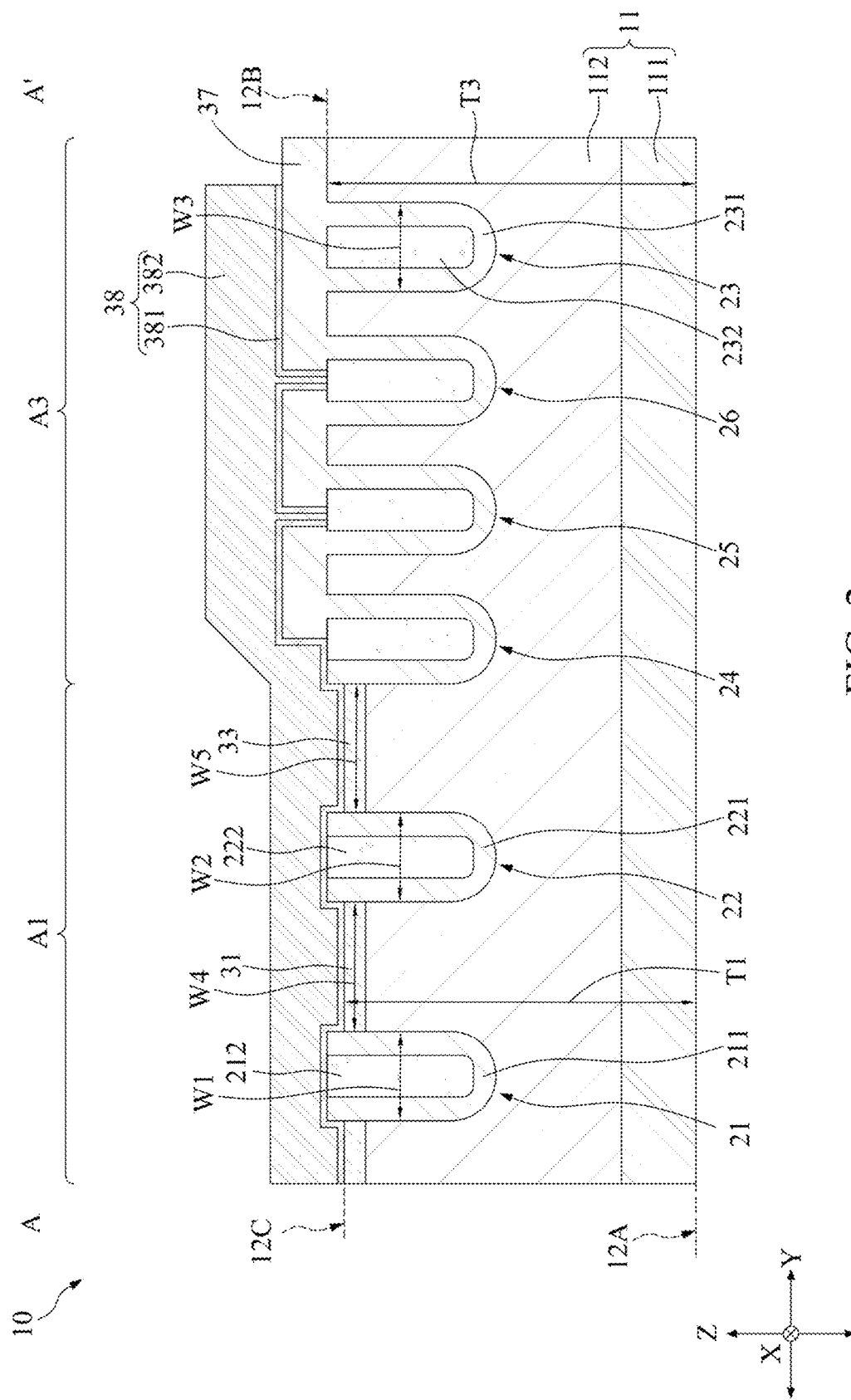
FIG. 2 shows a cross-sectional view of the semiconductor structure along a cutting line A-A' shown in FIG. 1 according to some embodiments of the present disclosure.
Figure 3:
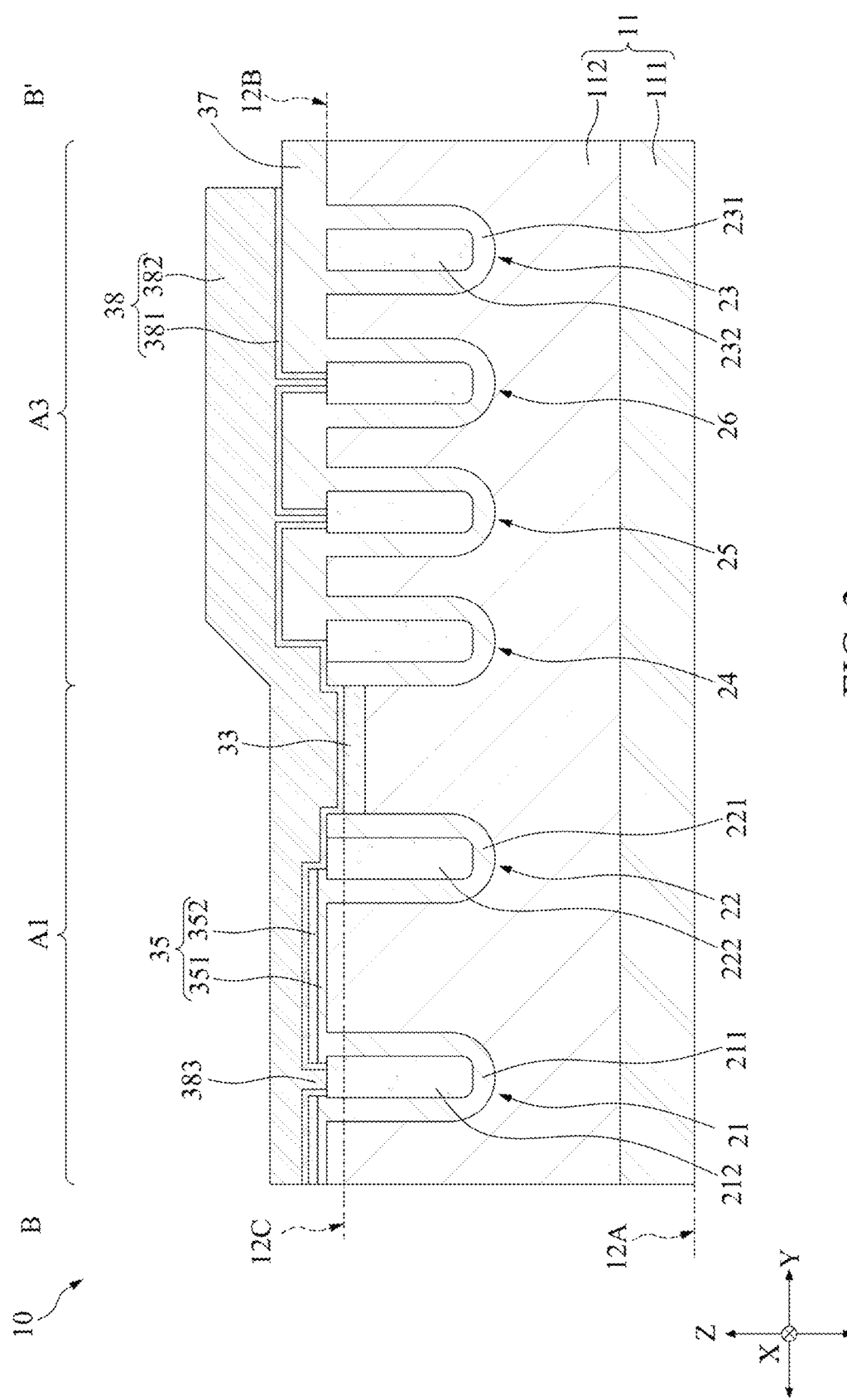
FIG. 3 shows a cross-sectional view of the semiconductor structure along a cutting line B-B' shown in FIG. 1 according to some embodiments of the present disclosure.
Figure 4:
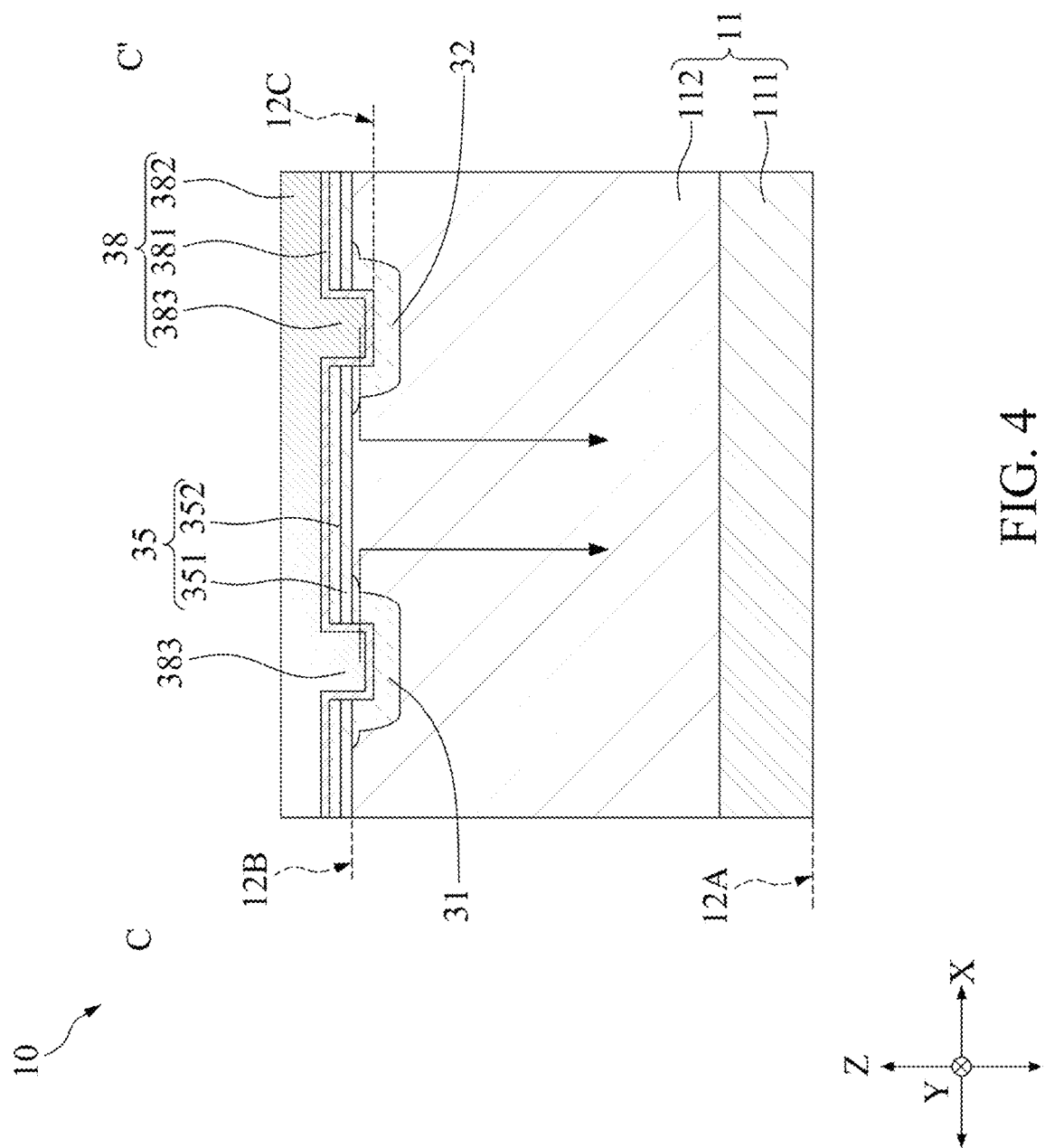
FIG. 4 shows a cross-sectional view of the semiconductor structure along a cutting line C-C' shown in FIG. 1 according to some embodiments of the present disclosure.

FIG. 1 shows a plan view of a semiconductor structure 10 according to some embodiments of the present case. FIG. 2 shows a cross-sectional view of the semiconductor structure 10 along a cutting line A-A' according to some embodiments of the present case. FIG. 3 shows a cross-sectional view of the semiconductor structure 10 along a cutting line B-B' according to some embodiments of the present case. FIG. 4 shows a cross-sectional view of the semiconductor structure 10 along a cutting line C-C' according to some embodiments of the present case. Specifically, the semiconductor structure 10 is a trench MOS rectifier device structure, and has a vertical current conduction path. For example, a current of the semiconductor structure 10 may be conducted vertically through the semiconductor structure 10.

In some embodiments, the semiconductor structure 10 includes a substrate 11, a first trench structure 21, and a second trench structure 22.

In some embodiments, the substrate 11 includes a base material 111 and an epitaxial layer 112 located on the base material 111. In some embodiments, the base material 111 includes, for example, silicon, silicon carbide (SiC), germanium (Ge), silicon germanium (SiGe), gallium nitride (GaN), gallium arsenide (GaAs), gallium arsenide phosphide (GaAsP), or other semiconductor materials. In some embodiments, the epitaxial layer 112 includes, for example, silicon, silicon carbide (SiC), germanium (Ge), silicon germanium (SiGe), gallium nitride (GaN), gallium arsenide (GaAs), gallium arsenide phosphide (GaAsP), or other semiconductor materials. The base material 111 is an N-type or P-type semiconductor material. The epitaxial layer 112 is an N-type or P-type semiconductor material. In some embodiments, the base material 111 and the epitaxial layer 112 are of the same conductivity type, and for example, the base material 111 and the epitaxial layer 112 are both N-type.

The base material 111 has the same conductivity type doping as the epitaxial layer 112. In some embodiments, the base material 111 is part of a silicon substrate or a silicon wafer. In some embodiments, the doping concentration of the base material 111 is greater than that of the epitaxial layer 112.

In some embodiments, a cell region A1 and a terminal region A3 adjacent to the cell region seen in a plan view are defined on the substrate 11. The cell region A1 is used to accommodate an active element or a passive element, and the terminal region A3 is used to be connected to a circuit terminal. In some embodiments, the terminal region A3 adjoins a side of the cell region A1. In some embodiments, the terminal region A3 surrounds the cell region A1. In some embodiments, the substrate 11 has a first thickness T1 in the cell region A1, and has a second thickness T3 in the terminal region A3, the second thickness T3 being greater than the first thickness T1.

In some embodiments, the substrate 11 may have a first surface 12A, a second surface 12B opposite the first surface 12A and located in the terminal region A3, and a third surface 12C opposite the first surface 12A and located in the cell region A1, and the second surface 12B and the third surface 12C are adjacent to each other and located at different levels. In some embodiments, the second surface 12B and the first surface 12A may be located on opposite sides of the substrate 11. In some embodiments, the first surface 12A, the second surface 12B, and the third surface 12C may be horizontal surfaces. For ease of description, a direction orthogonal to the first surface 12A, the second surface 12B, and the third surface 12C is defined as a vertical direction Z, and a plane formed by a first direction X and a second direction Y is orthogonal to the vertical direction Z. In some embodiments, the third surface 12C may be an active surface of the epitaxial layer 112. A bottom surface of the base material 111 is the first surface 12A, and may be used to contact a metal layer (not shown in the drawings, which may be formed on the first surface 12A to contact the base material 111, and serve as a drain or a cathode).

In some embodiments, the first trench structure 21 is located in the cell region A1, and traverses the third surface 12C to extend towards the first surface 12A. The first trench structure 21 includes a first semiconductor material layer 212 at least partially protruding from the third surface 12C and a first oxide layer 211 surrounding the first semiconductor material layer 212. In some embodiments, a top surface of the first trench structure 21 and the second surface 12B are coplanar. Seen in a plan view, the first trench structure 21 extends in the first direction X and along the third surface 12C.

The first oxide layer 211 is used to electrically isolate the first semiconductor material layer 212 from the epitaxial layer 112. In other words, the first semiconductor material layer 212 is separated from the epitaxial layer 112 by the in-trench first oxide layer 211. In some embodiments, a side wall and a bottom wall of the first semiconductor material layer 212 contact the first oxide layer 211. The thickness of the first oxide layer 211 may be adjusted according to, for example, the size of the first semiconductor material layer 212, an operating voltage, or the like. For example, the thickness of the first oxide layer 211 is less than the width of the in-trench first semiconductor material layer 212. In some embodiments, the first semiconductor material layer 212 includes a polysilicon material.

In some embodiments, the second trench structure 22 is located in the cell region A1, and traverses the third surface 12C to extend towards the first surface 12A. The second trench structure 22 includes a second semiconductor material layer 222 at least partially protruding from the third surface 12C and a second oxide layer 221 surrounding the second semiconductor material layer 222. In some embodiments, a top surface of the second trench structure 22 and the second surface 12B are coplanar. Seen in a plan view, the second trench structure 22 extends in the first direction X and along the third surface 12C. In some embodiments, the second trench structure 22 is located between the first trench structure 21 and the terminal region A3.

The second oxide layer 221 is used to electrically isolate the second semiconductor material layer 222 from the epitaxial layer 112. In other words, the second semiconductor material layer 222 is separated from the epitaxial layer 112 by the in-trench second oxide layer 221. In some embodiments, the second oxide layer 221 surrounds the second semiconductor material layer 222. In some embodiments, a side wall and a bottom wall of the second semiconductor material layer 222 contact the second oxide layer 221. The thickness of the second oxide layer 221 may be adjusted according to, for example, the size of the second semiconductor material layer 222, an operating voltage, or the like. For example, the thickness of the second oxide layer 221 is less than the width of the in-trench second semiconductor material layer 222. In some embodiments, the first oxide layer 211 and the second oxide layer 221 include the same material. In some embodiments, the first semiconductor material layer 212 and the second semiconductor material layer 222 include the same material. In some embodiments, the second semiconductor material layer 222 includes a polysilicon material. In some embodiments, the depth of the first trench structure 21 and the depth of the second trench structure 22 are substantially the same. In some embodiments, the width W1 of the first trench structure 21 and the width W2 of the second trench structure 22 are substantially the same.

In some embodiments, the semiconductor structure 10 further includes a third trench structure 23. The third trench structure 23 is located in the terminal region A3, and extends from the second surface 12B towards the first surface 12A. The third trench structure 23 is located at an outer periphery of the semiconductor structure 10. The third trench structure 23 includes a third semiconductor material layer 232 and a third oxide layer 231 surrounding the third semiconductor material layer 232, and the third trench structure 23 extends in the first direction X. In some embodiments, a top surface of the third trench structure 23 and the second surface 12B are coplanar. In some embodiments, the top surfaces of the first trench structure 21, the second trench structure 22, and the third trench structure 23 are coplanar. Seen in a plan view, the third trench structure 23 extends in the first direction X and along the third surface 12C. In some embodiments, the second trench structure 22 is located between the first trench structure 21 and the third trench structure 23.

The third oxide layer 231 is used to electrically isolate the third semiconductor material layer 232 from the epitaxial layer 112. In other words, the third semiconductor material layer 232 is separated from the epitaxial layer 112 by the in-trench third oxide layer 231. In some embodiments, the third oxide layer 231 surrounds the third semiconductor material layer 232. In some embodiments, a side wall and a bottom wall of the third semiconductor material layer 232 contact the third oxide layer 231. The thickness of the third oxide layer 231 may be adjusted according to, for example, the size of the third semiconductor material layer 232, an operating voltage, or the like. For example, the thickness of the third oxide layer 231 is less than the width of the in-trench third semiconductor material layer 232. In some embodiments, the first oxide layer 211 and the third oxide layer 231 include the same material. In some embodiments, the first semiconductor material layer 212 and the third semiconductor material layer 232 include the same material. In some embodiments, the third semiconductor material layer 232 includes a polysilicon material. In some embodiments, the depth of the first trench structure 21 and the depth of the third trench structure 23 are substantially the same. In some embodiments, the width W1 of the first trench structure 21 and the width W3 of the third trench structure 23 are substantially the same.

In some embodiments, the semiconductor structure 10 further includes a plurality of trench structures located between the second trench structure 22 and the third trench structure 23, for example, includes a fourth trench structure 24, a fifth trench structure 25, and a sixth trench structure 26. In some embodiments, the third trench structure 23 is farthest from the cell region A1 as compared to the fourth trench structure 24, the fifth trench structure 25, and the sixth trench structure 26. In some embodiments, the third trench structure 23 is located at the outer periphery of the semiconductor structure 10, and the fourth trench structure 24, the fifth trench structure 25, and the sixth trench structure 26 are located between the second trench structure 22 and the third trench structure 23. In some embodiments, the fourth trench structure 24, the fifth trench structure 25, and the sixth trench structure 26 are located in the terminal region A3, extend from the second surface 12B towards the first surface 12A and extend parallel to the first direction X. In some embodiments, the fourth trench structure 24, the fifth trench structure 25, and the sixth trench structure 26 have substantially the same structure as the third trench structure 23. In some embodiments, top surfaces of the fourth trench structure 24, the fifth trench structure 25, and the sixth trench structure 26 are respectively coplanar with the second surface 12B. In some embodiments, the top surfaces of the third trench structure 23, the fourth trench structure 24, the fifth trench structure 25, and the sixth trench structure 26 are coplanar. Seen in a plan view, the fourth trench structure 24, the fifth trench structure 25, and the sixth trench structure 26 each extend in the first direction X and along the third surface 12C.

A first doped region 31 is provided at the third surface 12C of the substrate 11. When seen in a plan view, the first doped region 31 is provided between the first trench structure 21 and the second trench structure 22, and extends in the second direction Y perpendicular to the first direction X and along the third surface 12C. In some embodiments, the semiconductor structure 10 includes a plurality of doped regions provided between the first trench structure 21 and the second trench structure 22. In some embodiments, the first doped region 31 is located above the epitaxial layer 112, and adjoins the third surface 12C. The first doped region 31 has a different conductivity type. In some embodiments, the first doped region 31 has a conductivity type that is a second type. In some embodiments, the first doped region 31 is P-type, and the epitaxial layer 112 is N-type. In some embodiments, the doping concentration of the first doped region 31 is greater than that of the epitaxial layer 112. In some embodiments, the first doped region 31 includes a P-type dopant, and the P-type dopant may be, for example, boron, aluminum, gallium, indium, and the like. In some embodiments, the P-type dopant included by the first doped region 31 is boron.

In some embodiments, a second doped region 32 is provided at the third surface 12C of the substrate 11. When seen in a plan view, the second doped region 32 is provided between the first trench structure 21 and the second trench structure 22, and is adjacent to the first doped region 31. In some embodiments, the second doped region 32 is spaced apart from the first doped region 31. The distance D between the second doped region 32 and the first doped region 31 may be adjusted according to requirements and a process capability, and a distance D1 is greater than 0. In some embodiments, the second doped region 32 extends in the same direction as the first doped region 31, and for example, the second doped region 32 extends in the second direction Y. In some embodiments, the second doped region 32 is located above the epitaxial layer 112, and adjoins the third surface 12C. The second doped region 32 has a conductivity type different from that of the epitaxial layer 112. For example, the second doped region 32 is P-type, and the epitaxial layer 112 is N-type. The second doped region 32 has the same conductivity type as the first doped region 31. For example, the second doped region 32 and the first doped region 31 are both P-type. In some embodiments, the doping concentration of the second doped region 32 is greater than that of the epitaxial layer 112. In some embodiments, the doping concentration of the second doped region 32 is substantially the same as that of the first doped region 31. In some embodiments, the second doped region 32 includes a P-type dopant, and the P-type dopant may be, for example, boron, aluminum, gallium, indium, and the like. In some embodiments, the P-type dopant included by the second doped region 32 is boron.

A mask layer 35 is located in the cell region A1 and on the second surface 12B. In some embodiments, the mask layer 35 is separated from the terminal region A3. In some embodiments, the mask layer 35 covers part of the first trench structure 21 and part of the second trench structure 22. An upper surface of the mask layer 35 is higher than the first doped region 31 and the second doped region 32. At least part of the first semiconductor material layer 212 and at least part of the second semiconductor material layer 222 are exposed from the mask layer 35. At least part of the first oxide layer 211 and at least part of the second oxide layer 221 are exposed from the mask layer 35.

When seen in a plan view, the mask layer 35 is located between the first doped region 31 and the second doped region 32. In some embodiments, the mask layer 35 includes a first opening 41 and a second opening 42. The first opening 41 extends in the first direction X such that at least part of the first semiconductor material layer 212 is exposed, and the second opening 42 extends in the second direction Y perpendicular to the first direction X such that at least part of the second surface 12B and the first trench structure 21 are exposed. The first opening 41 and the second opening 42 intersect. The first doped region 31 is located in the second opening 42. In some embodiments, the mask layer 35 further includes a third opening 43 extending in the second direction Y perpendicular to the first direction X such that at least part of the second surface 12B and the first trench structure 21 are exposed. The third opening 43 is parallel to the second opening 42, and intersects the first opening 41. The second doped region 32 is located in the third opening 43. When seen in a plan view, the first doped region 31 and the second doped region 32 are provided between the first trench structure 21 and the second trench structure 22, and are staggered with respect to the mask layer 35.

In some embodiments, the mask layer 35 includes a fourth oxide layer 351 and a fourth semiconductor material layer 352 provided on the fourth oxide layer 351. The fourth oxide layer 351 is provided on the second surface 12B, and covers at least part of the first trench structure 21 and at least part of the second trench structure 22. The fourth oxide layer 351 contacts the first oxide layer 211 and the second oxide layer 221. In some embodiments, the fourth oxide layer 351 is a gate oxide layer. In some embodiments, the fourth oxide layer 351 has a thickness of 50 Å to 150 Å. In some embodiments, the fourth semiconductor material layer 352 includes a polysilicon material.

In some embodiments, the third surface 12C of the substrate 11 is further provided with a third doped region 33. When seen in a plan view, the third doped region 33 is provided at a periphery of the cell region A1, and extends in the first direction X. In some embodiments, the third doped region 33 is provided between the second trench structure 22 and the third trench structure 23. In some embodiments, the third doped region 33 is provided between the second trench structure 22 and the terminal region A3. The second trench structure 22 is located between the first doped region 31 and the third doped region 33. In some embodiments, the third doped region 33 is located above the epitaxial layer 112, and adjoins the third surface 12C. The third doped region 33 has a conductivity type different from that of the epitaxial layer 112. For example, the third doped region 33 is P-type, and the epitaxial layer 112 is N-type. The third doped region 33, the second doped region 32, and the first doped region 31 have the same conductivity type, and are all, for example, P-type. In some embodiments, the doping concentration of the third doped region 33 is greater than that of the epitaxial layer 112. In some embodiments, the first doped region 31, the second doped region 32, and the third doped region 33 are heavily doped regions. In some embodiments, the first doped region 31, the second doped region 32, and the third doped region 33 are bulk-doped regions. In some embodiments, the doping concentration of the first doped region 31, the doping concentration of the second doped region 32, and the doping concentration of the third doped region 33 are substantially the same.

In some embodiments, the third doped region 33 includes a P-type dopant, and the P-type dopant may be, for example, boron, aluminum, gallium, indium, and the like. In some embodiments, the P-type dopant included by the third doped region 33 is boron. The width W5 of the third doped region 33 and the width W4 of the first doped region 31 may be the same or different. In some embodiments, the width W5 of the third doped region 33 and the width W4 of the first doped region 31 are substantially the same.

In some embodiments, the third doped region 33 is a first mesa surface between the cell region A1 and the terminal region A3. In some embodiments, the first mesa surface separates the second trench structure 22 of the cell region A1 from the third trench structure 23 of the terminal region A3. The width D2 of the first mesa surface may be regulated by the positions of the second trench structure 22 and the third trench structure 23. In some embodiments, the width D2 of the first mesa surface may be regulated by the positions of the second trench structure 22 and the fourth trench structure 24.

The semiconductor structure 10 further includes a conductive layer 38 that electrically connects the first trench structure 21 to the second trench structure 22. The conductive layer 38 is provided above the first doped region 31 and the second doped region 32, and covers at least part of the mask layer 35. The conductive layer 38 is further provided in the first opening 41, the second opening 42, and the third opening 43, and is electrically connected to the first semiconductor material layer 212 and the second semiconductor material layer 222. In some embodiments, the conductive layer 38 extends along a side wall of the mask layer 35, and contacts and is electrically connected to the first semiconductor material layer 212 and the second semiconductor material layer 222. In some embodiments, the conductive layer 38 contacts and is electrically connected to portions of the fourth trench structure 24, the fifth trench structure 25, and the sixth trench structure 26. In some embodiments, the conductive layer 38 includes a conductive material, such as a metal, which may be, but is not limited to, for example, copper (Cu), gold (Au), silver (Ag), aluminum (Al), nickel (Ni), titanium (Ti), tungsten (W), tin (Sn), titanium nitride (TiN), an aluminum-silicon (AlSi) alloy, an aluminum-silicon-copper (AlSiCu) alloy, or another metal or alloy. In some embodiments, a portion of the conductive layer 38 surrounded by the mask layer 35 serves as a conductive plug 383. In some embodiments, the conductive plug 383 is columnar, and has substantially the same width in the vertical direction Z. In some embodiments, the conductive plug 383 has a shape that is wide at the top and narrow at the bottom, and the width of the conductive plug 383 has a trend of decreasing in the vertical direction Z from the conductive layer 38 towards the first surface 12A.

In some embodiments, the conductive layer 38 includes a first conductive layer 381 provided on the mask layer 35, extending along the side wall of the mask layer 35, and contacting the first semiconductor material layer 212 and the second semiconductor material layer 222. In some embodiments, the first conductive layer 381 is a seed layer. The conductive layer 38 includes a second conductive layer 382 provided on the first conductive layer 381, extending along a side wall of the first conductive layer 381, and contacting the first semiconductor material layer 212 and the second semiconductor material layer 222.

In some embodiments, the conductive layer 38 is provided at the cell region A1 and the terminal region A3. The conductive layer 38 is provided above the third doped region 33. The semiconductor structure 10 further includes a fifth oxide layer 37 provided between the third trench structure 23 and the conductive layer 38. The fifth oxide layer 37 is provided at the terminal region A3 and is located on the second surface 12B. In some embodiments, the fifth oxide layer 37 is provided above the third trench structure 23, the fourth trench structure 24, the fifth trench structure 25, and the sixth trench structure 26. In some embodiments, the conductive layer 38 is provided above the first doped region 31, above the second doped region 32, and above the fifth oxide layer 37. In some embodiments, at least part of the fourth trench structure 24, the fifth trench structure 25, and the sixth trench structure 26 is exposed from the fifth oxide layer 37, and contacts and is electrically connected to the conductive layer 38. In some embodiments, the conductive layer 38 traverses the fifth oxide layer 37, and is electrically connected to the fourth trench structure 24, the fifth trench structure 25, and the sixth trench structure 26. In some embodiments, an edge 371 of the fifth oxide layer 37 is exposed from the conductive layer 38.

In some embodiments, the third trench structure 23 is covered by the fifth oxide layer 37. In some embodiments, the fifth oxide layer 37 is located between the third trench structure 23 and the conductive layer 38, and electrically isolates the third trench structure 23 from the conductive layer 38. The third trench structure 23 is located at a periphery of the semiconductor structure 10, and is floated or dummy to prevent expansion of a depletion region when the semiconductor structure 10 is subjected to a reverse bias.

When a forward bias is present, as indicated by arrows in FIG. 1 and FIG. 4, a current may flow from the conductive layer 38 provided in the second opening 42 into the first doped region 31, flow from the first doped region 31 into the epitaxial layer 112, and flow from the third surface 12C towards the first surface 12A. When a forward bias is present, a current may also flow from the conductive layer 38 provided in the third opening 43 into the second doped region 32, flow from the second doped region 32 into the epitaxial layer 112, and flow from the third surface 12C towards the first surface 12A. In some embodiments, an active surface of the semiconductor structure 10 is the third surface 12C. A current of the semiconductor structure 10 may flow in a direction orthogonal to the active surface of the semiconductor structure 10. In some embodiments, the current of the semiconductor structure 10 flows in the vertical direction Z.

In some embodiments, the first doped region 31 and the second doped region 32 each form a second mesa surface between the first trench structure 21 and the second trench structure 22. In some embodiments, the widths of the second mesa surfaces may be regulated by the positions of the first trench structure 21 and the second trench structure 22. The first trench structure 21 and the second trench structure 22 may reduce an electric field at the second mesa surface, thereby reducing a reverse leakage current of the semiconductor structure 10. In addition, the direction of extension of a channel is perpendicular to the directions of extension of the first trench structure 21 and the second trench structure 22, that is, the channel position may be adjusted (for example, the channel is made narrower) by means of a process, so that a forward bias is lower, and channel density can be increased, thereby increasing current density.

FIG. 5 to FIG. 25 show one or more stages in a manufacturing method for a semiconductor structure according to some embodiments of the present case. At least some of these figures have been simplified to facilitate a better understanding of aspects of the present disclosure.

Figure 5:
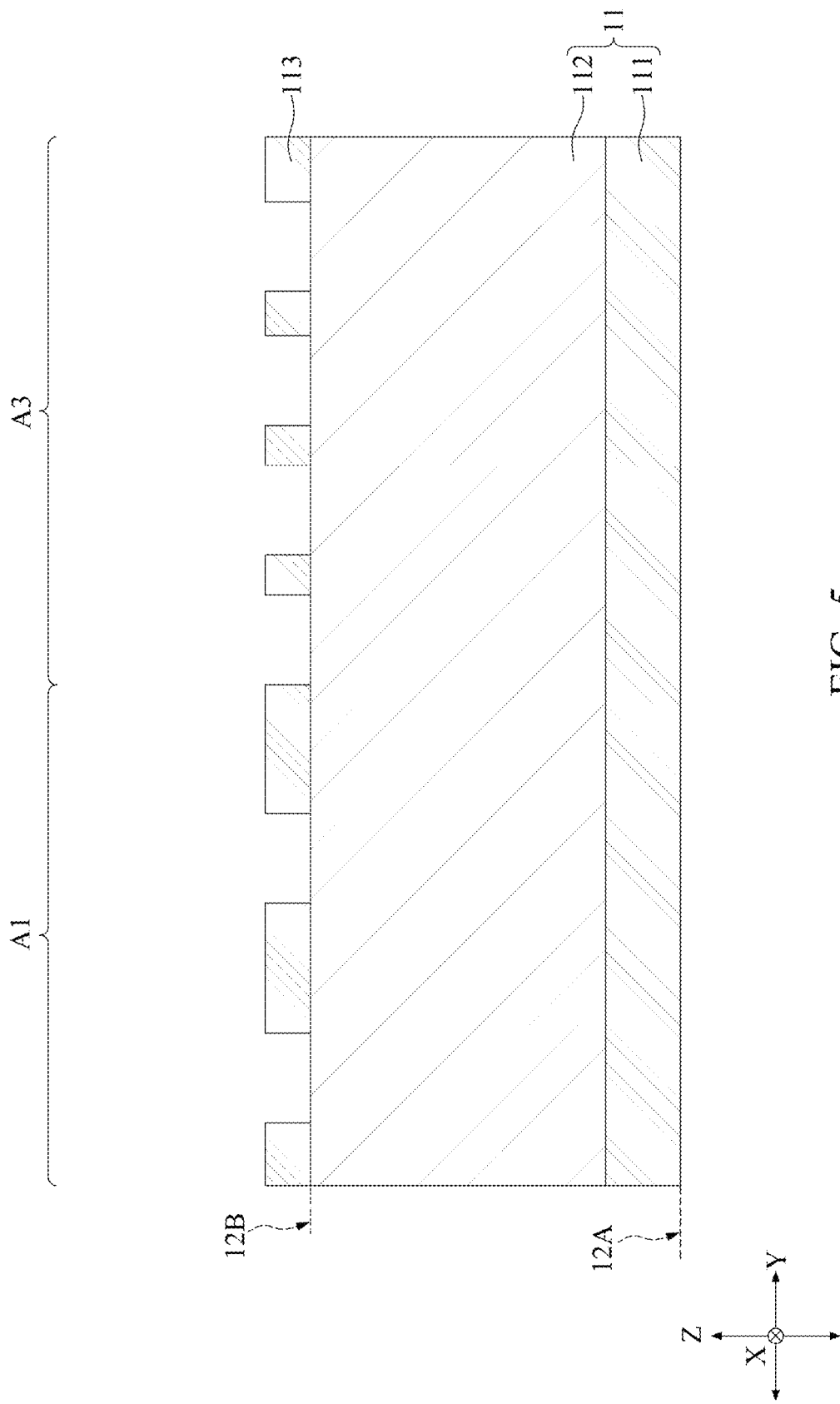
FIGS. 5 to 25 show one or more stages in a manufacturing method for a semiconductor structure according to some embodiments of the present disclosure.
Figure 6:
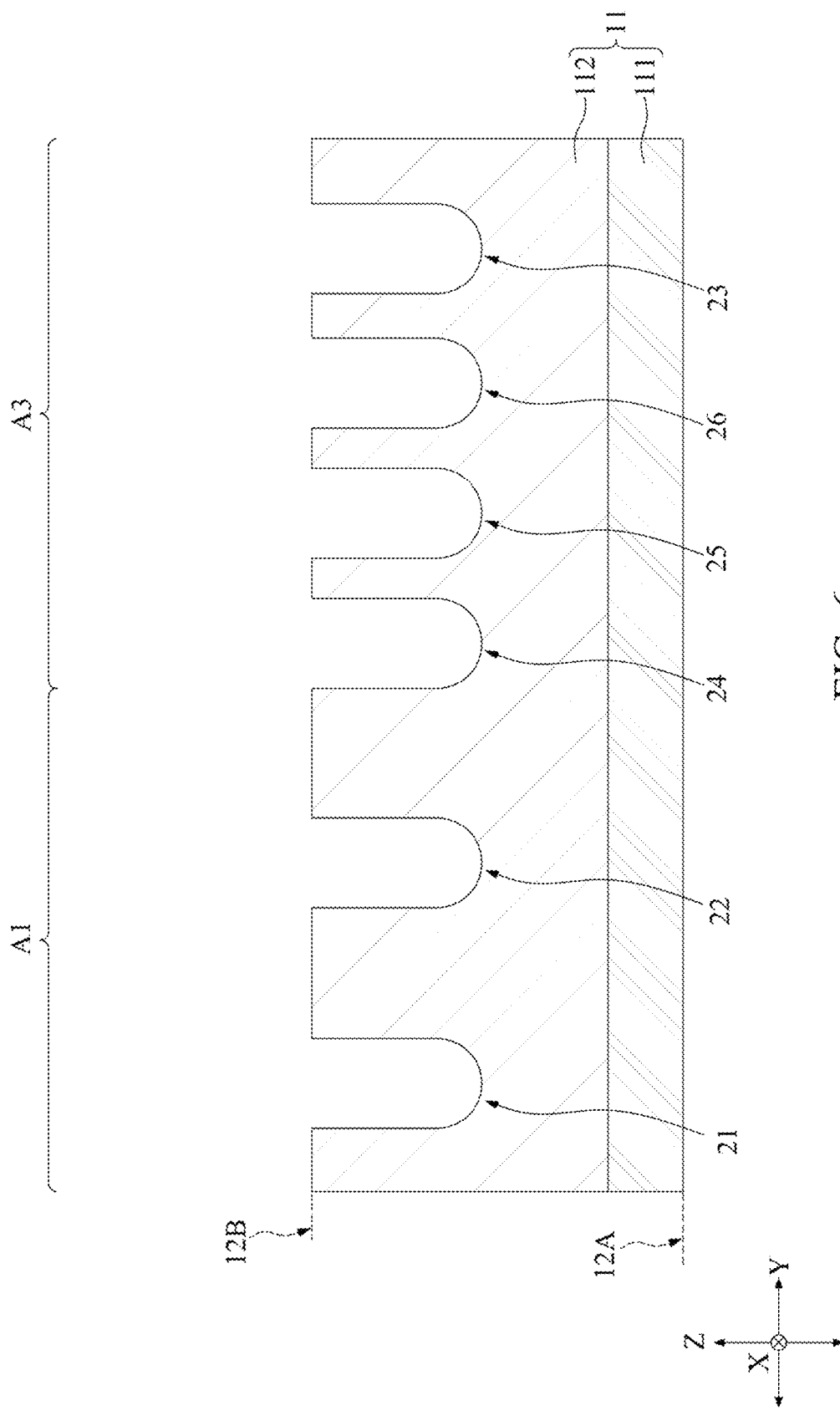

Referring to FIG. 5 and FIG. 6, a substrate 11 may include a base material 111 and an epitaxial layer 112 located on the base material 111. The manufacturing method includes epitaxial growth of the base material 111 to form the epitaxial layer 112. The base material 111 has a first surface 12A of the substrate 11. The epitaxial layer 112 has a second surface 12B of the substrate 11. The first surface 12A is opposite the second surface 12B. In some embodiments, ion implantation is performed at the same time as the epitaxial growth to implant ions having N-type electrical properties to form an N-type epitaxial layer 112.

A patterned mask layer 113 (hereinafter generally referred to as a first mask layer) as shown in FIG. 5 is formed on the epitaxial layer 112 to define the positions of a first trench 210, a second trench 220, and a third trench 230 as shown in FIG. 6. An etching process (e.g., a plasma dry etching process) is performed on the epitaxial layer 112 by means of the first mask layer 113 to form the first trench 210, the second trench 220, and the third trench 230. The etching process removes the epitaxial layer 112 from the second surface 12B, and stops in the epitaxial layer 112. According to the positions defined by the first mask layer 113, the first trench 210, the second trench 220, and the third trench 230 are formed at intervals in the substrate 11 in a first direction X, and extend from the second surface 12B towards the first surface 12A opposite the second surface. The first trench 210 and the second trench 220 are formed in a cell region A1 of the substrate 11, and the third trench 230 is formed in a terminal region A3 of the substrate 11.

In some embodiments, the first trench 210, the second trench 220, and the third trench 230 may have vertical side walls. The first trench 210, the second trench 220, and the third trench 230 may have curved bottom surfaces. In addition, the first trench 210, the second trench 220, and the third trench 230 may be circular, elliptical, rectangular, or polygonal. In some embodiments, the first trench 210, the second trench 220, and the third trench 230 have the same width. In some embodiments, the first trench 210, the second trench 220, and the third trench 230 have the same depth. In some embodiments, a fourth trench 240, a fifth trench 250, and a sixth trench 260 are formed at intervals in the substrate 11 in the first direction X, and extend from the second surface 12B towards the first surface 12A opposite the second surface. The fourth trench 240, the fifth trench 250, and the sixth trench 260 are located between the second trench 220 and the third trench 230.

Figure 7:
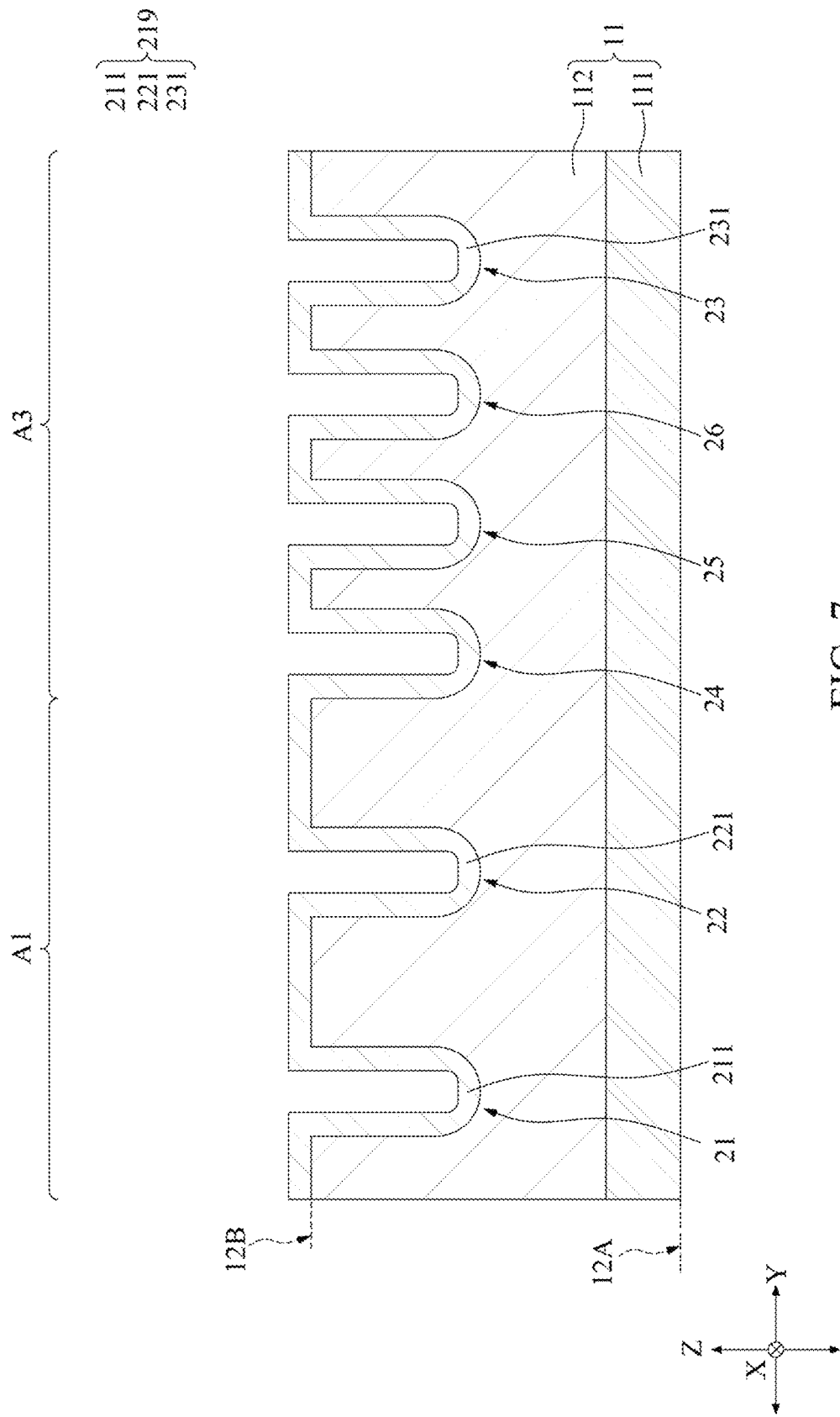

Referring to FIG. 7, the manufacturing method includes forming an in-trench oxide layer 219 in the first trench 210, the second trench 220, and the third trench 230. In some embodiments, the in-trench oxide layer 129 covers the second surface 12B. In some embodiments, the in-trench oxide layer 219 may be formed be formed via thermal oxidation technology or other deposition processes. In some embodiments, the in-trench oxide layer 219 may be shape-preservingly or conformally deposited on inner side surfaces (including opposing side walls and a bottom extending between the side walls) of the first trench 210, the second trench 220, and the third trench 230. In some embodiments, the in-trench oxide layer 219 may be filled into the first trench 210, the second trench 220, and the third trench 230 via a deposition process, so that the in-trench oxide layer 219 forms at least one recess in each of the first trench 210, the second trench 220, and the third trench 230. In some embodiments, a portion of the in-trench oxide layer 129 in the first trench 210 is a first oxide layer 211. A portion of the in-trench oxide layer 219 in the second trench 220 is a second oxide layer 221. A portion of the in-trench oxide layer 219 in the third trench 230 is a third oxide layer 231. The first oxide layer 211, the second oxide layer 221, and the third oxide layer 231 are simultaneously formed.

Figure 8:
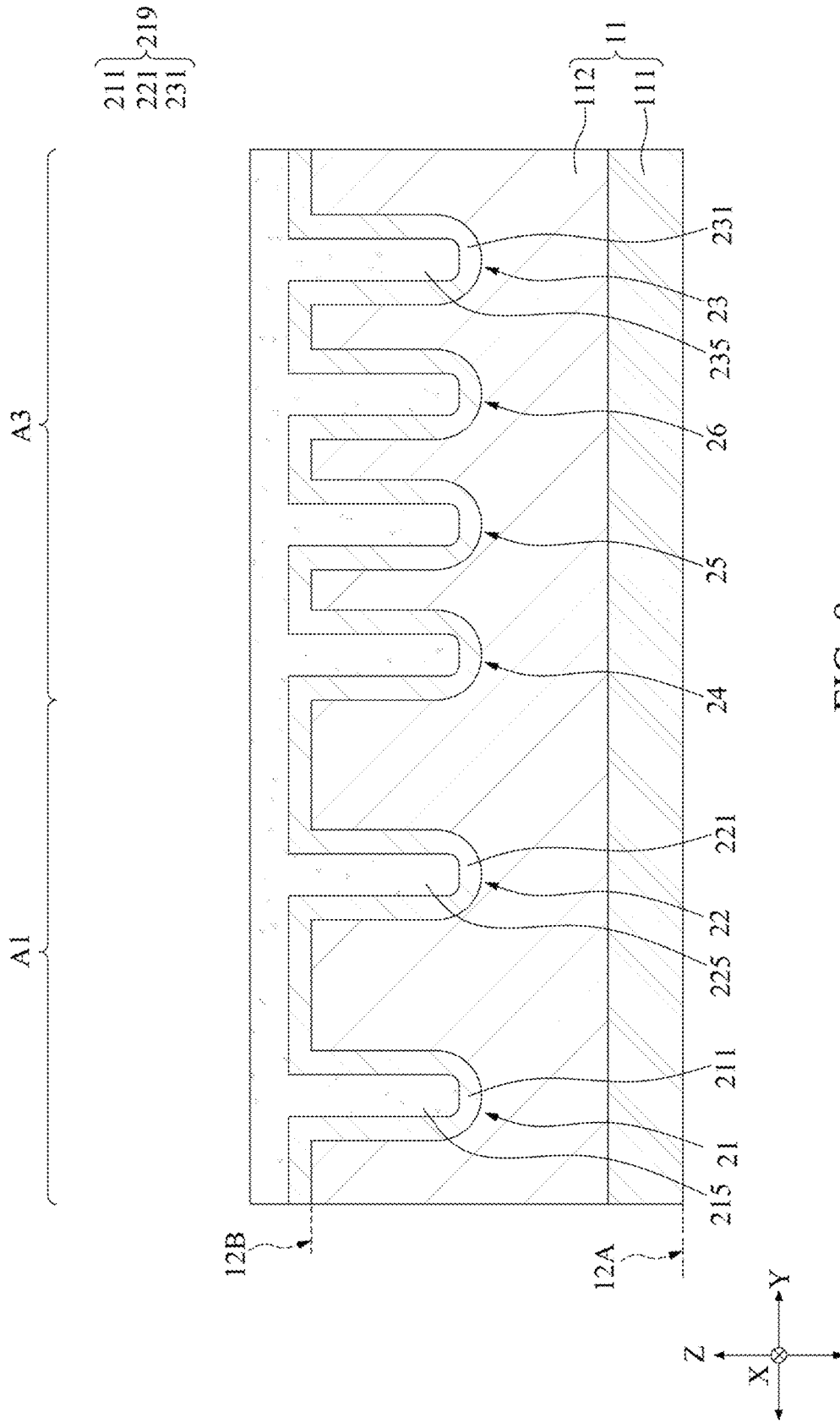

Referring to FIG. 8, the manufacturing method includes respectively forming a first semiconductor material 215, a second semiconductor material 225, and a third semiconductor material 235 in the first trench 210, the second trench 220, and the third trench 230. In some embodiments, the first semiconductor material 215 is placed in the first trench 210 and on a top surface of the first oxide layer 211. The second semiconductor material 225 is placed in the second trench 220 and on a top surface of the second oxide layer 225. The third semiconductor material 235 is placed in the third trench 230 and on a top surface of the third oxide layer 231.

The in-trench oxide layer 219 may surround the first semiconductor material 215, the second semiconductor material 225, and the third semiconductor material 235. In some embodiments, the first semiconductor material 215, the second semiconductor material 225, and the third semiconductor material 235 may be formed via physical vapor deposition (PVD), such as sputtering or spraying. In some embodiments, the first semiconductor material 215, the second semiconductor material 225, and the third semiconductor material 235 may be formed via plating or CVD. In some embodiments, the semiconductor material may cover the in-trench oxide layer 219. Then, a dry etching process is performed to remove the semiconductor material other than the first trench 210, the second trench 220, and the third trench 230 by using, for example, a method such as etching, so as to form the first semiconductor material 215, the second semiconductor material 225, and the third semiconductor material 235. In some embodiments, the semiconductor material includes polysilicon.

Figure 9:
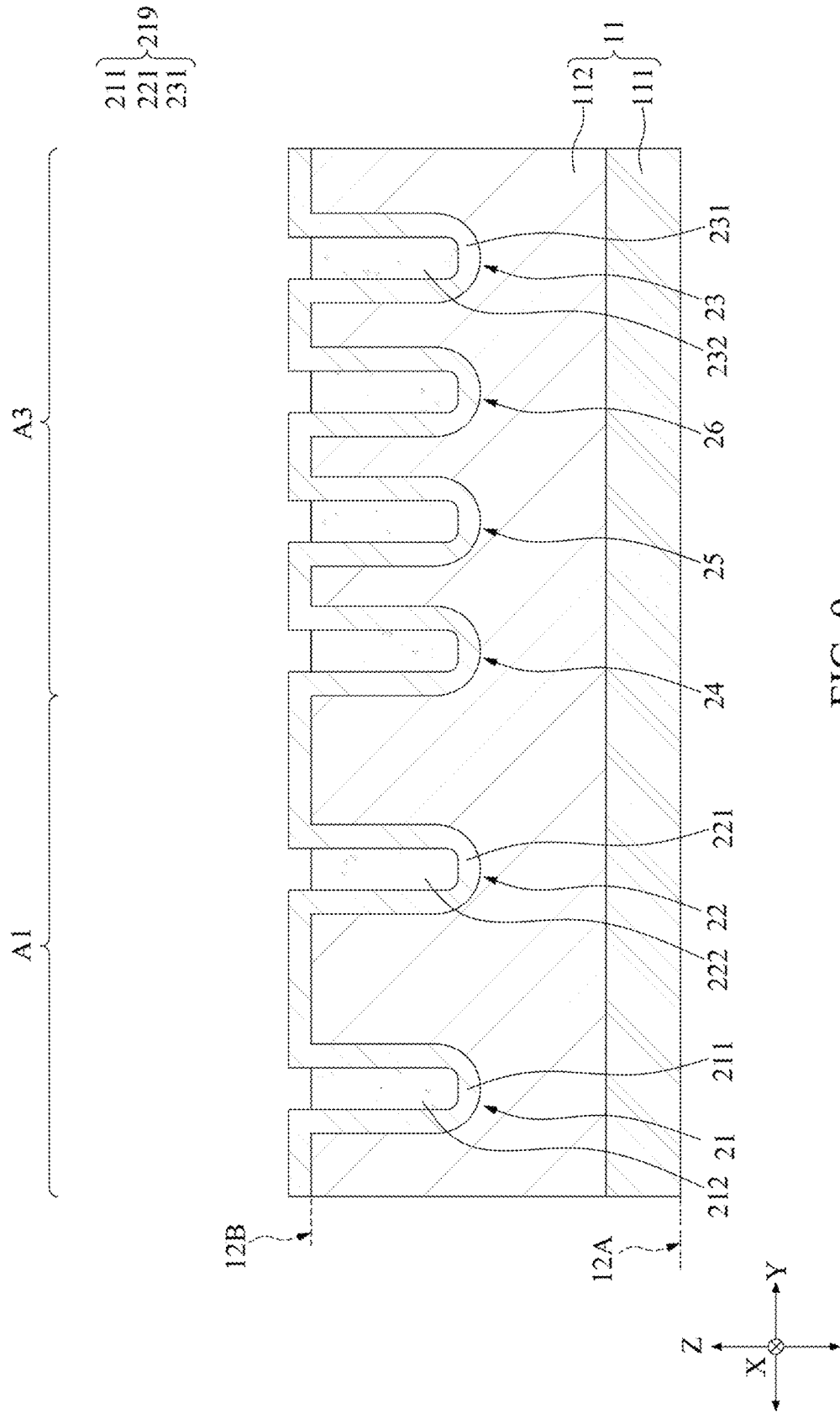

Referring to FIG. 9, the manufacturing method includes forming a first semiconductor material layer 212, a second semiconductor material layer 222, and a third semiconductor material layer 232 in the first trench 210, the second trench 220, and the third trench 230, respectively, to cause the first semiconductor material layer 212 to be surrounded by the first oxide layer 211 and to form a first trench structure 21, to cause the second semiconductor material layer 222 to be surrounded by the second oxide layer 221 and to form a second trench structure 22, and to cause the third semiconductor material layer 232 to be surrounded by the third oxide layer 231 and to form a third trench structure 23. In some embodiments, top surfaces of the first semiconductor material layer 212, the second semiconductor material layer 222, and the third semiconductor material layer 232 are substantially coplanar with the second surface 12B.

In some embodiments, the first semiconductor material 215, the second semiconductor material 225, and the third semiconductor material 235 are etched to form the first semiconductor material layer 212, the second semiconductor material layer 222, and the third semiconductor material layer 232, respectively. An etching process is used to remove at least part of the first semiconductor material 215 in the first trench 210, at least part of the second semiconductor material 225 in the second trench 220, and at least part of the third semiconductor material 235 in the third trench 230. The first semiconductor material layer 212, the second semiconductor material layer 222, and the third semiconductor material layer 232 may be positionally defined by a second mask layer (not shown in the drawing), and formed by performing a dry etching process. The dry etching process removes part of the first semiconductor material 215, part of the second semiconductor material 225, and part of the third semiconductor material 235, and stops at a predetermined depth in the first semiconductor material 215, the second semiconductor material 225, and the third semiconductor material 235.

For ease of description, the first semiconductor material layer 212 and the first oxide layer 211 are collectively referred to as the first trench structure 21, and the second semiconductor material layer 222 and the second oxide layer 221 are collectively referred to as the second trench structure 22. Similarly, the third semiconductor material layer 232 and the third oxide layer 231 are collectively referred to as the third trench structure 23. The first trench structure 21, the second trench structure 22, and the third trench structure 23 are simultaneously formed. In some embodiments, the fourth trench structure 24, the fifth trench structure 25, and a sixth trench structure 26 are formed simultaneously with the first trench structure 21, the second trench structure 22, and the third trench structure 23.

Figure 10:
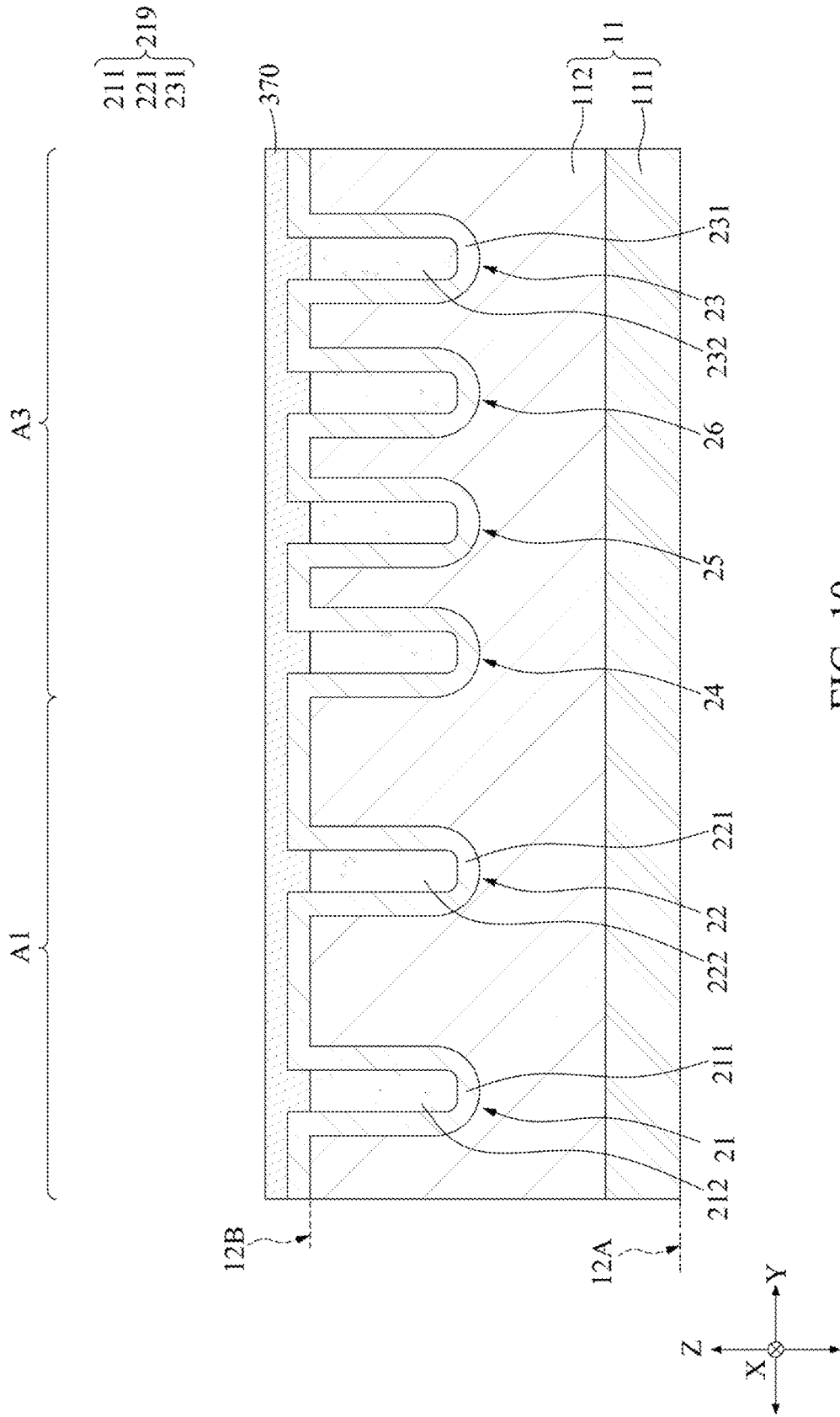

In some embodiments, an oxide layer 370 is formed on the third trench structure 23, so that the oxide layer 370 covers the third trench structure 23. Referring to FIG. 10, the manufacturing method includes forming the oxide layer 370 on the first trench structure 21, the second trench structure 22, and the third trench structure 23. In some embodiments, the oxide layer 370 is formed on the in-trench oxide layer 219, and covers the first trench structure 21, the second trench structure 22, and the third trench structure 23. The oxide layer 370 contacts the first semiconductor material layer 212, the second semiconductor material layer 222, and the third semiconductor material layer 232. In some embodiments, the oxide layer 370 further contacts the semiconductor material layer of the fourth trench structure 24, the fifth trench structure 25, and the sixth trench structure 26.

The oxide layer 370 and the in-trench oxide layer 219 may include the same or different materials. In some embodiments, the oxide layer 370 may be formed via ALD, CVD, or other deposition processes. In some embodiments, after the oxide layer 370 is formed, a polishing process, such as a CMP process, is performed, to planarize a top surface of the oxide layer 370.

Figure 11:
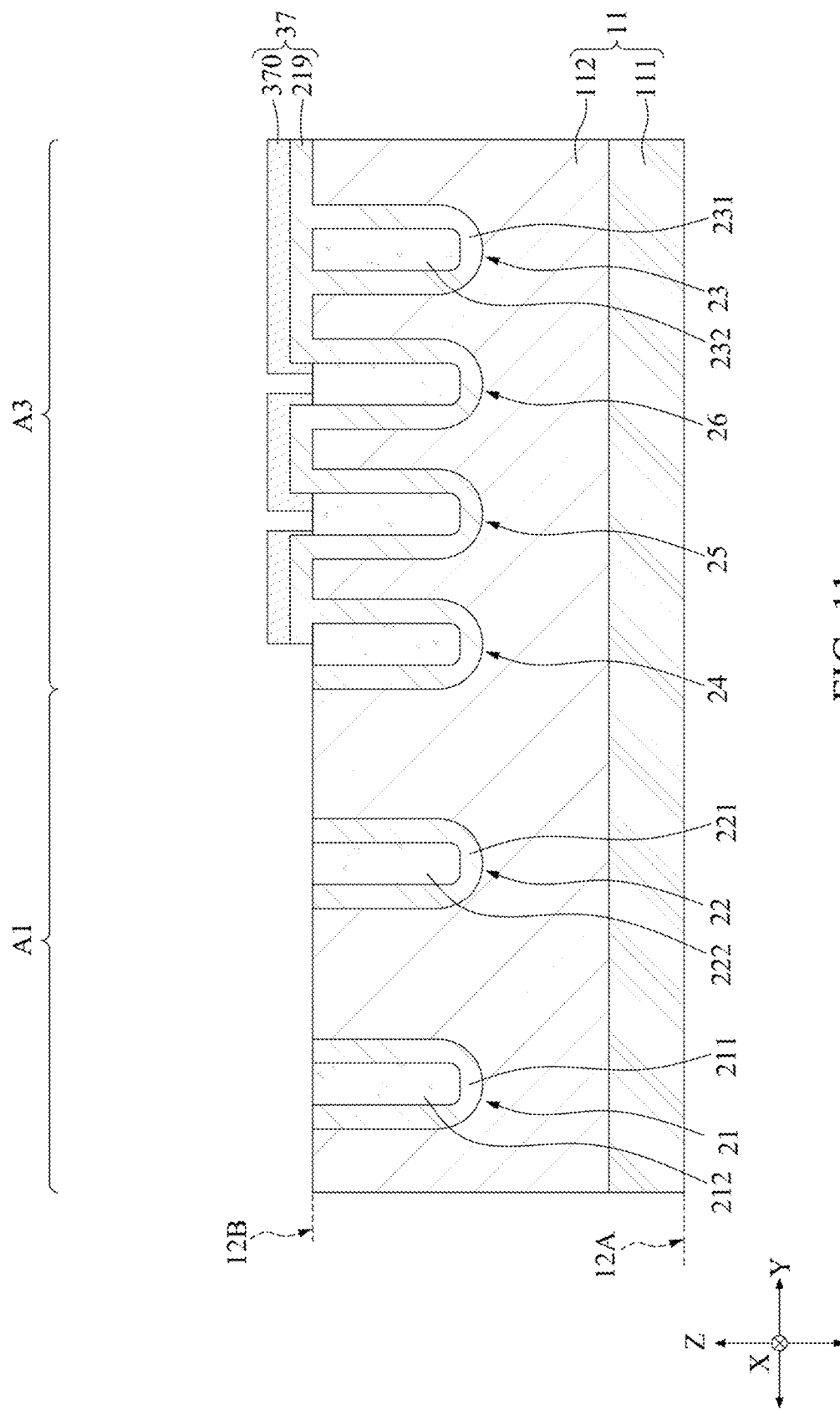

Referring to FIG. 11, the manufacturing method includes removing part of the oxide layer 370 and part of the in-trench oxide layer 219, such that the substrate 11, the first trench structure 21, and the second trench structure 22 located in the cell region A1 are exposed. In some embodiments, the oxide layer 370 and the in-trench oxide layer 219 are locally removed by means of lithography and an etching process. In some embodiments, at least part of the semiconductor material 112 of the fourth trench structure 24, the fifth trench structure 25, and the sixth trench structure 26 is respectively exposed from the oxide layer 370. In some embodiments, after part of the oxide layer 370 and part of the in-trench oxide layer 219 are removed, the oxide layer 370 and the in-trench oxide layer 219 are provided only in the terminal region A3, and the oxide layer 370 covers the in-trench oxide layer 219 and the third trench structure 23, exposing the second surface 12B of the cell region. For ease of description, the in-trench oxide layer 219 and the oxide layer 370 located in the terminal region A3 are hereinafter collectively referred to as a fifth oxide layer 37.

Figure 12:
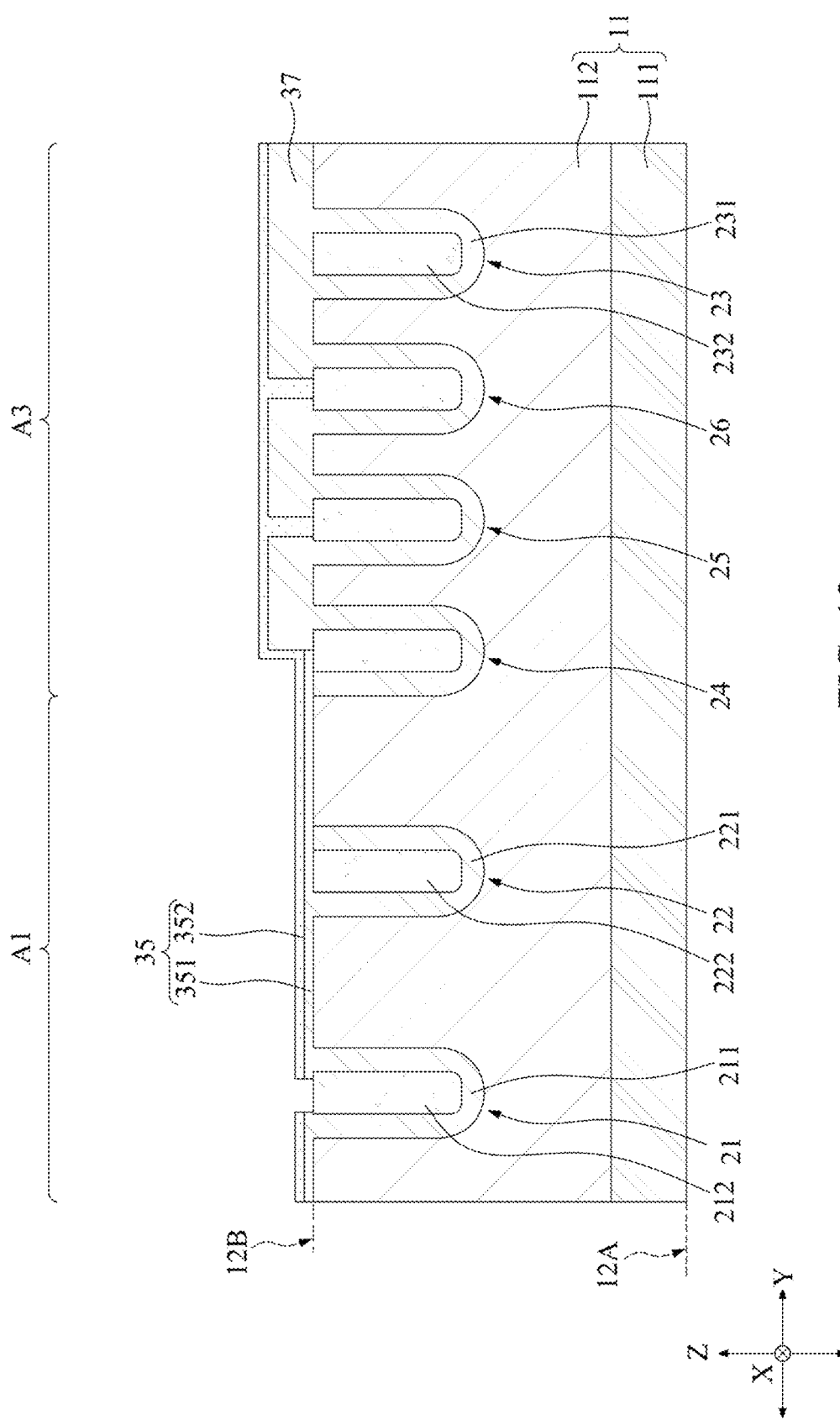

The manufacturing method includes forming a mask layer 35 on the cell region A1, the first trench structure 21, and the second trench structure 22. Referring to FIG. 12, the manufacturing method includes forming a fourth oxide layer 351 on the second surface 12B of the cell region and the fifth oxide layer 37, and forming a fourth semiconductor material layer 352 on the fourth oxide layer 351. The fourth oxide layer 351 and the fifth oxide layer 37 may include the same or different materials. In some embodiments, the thickness of the fourth oxide layer 351 is less than that of the fifth oxide layer 37. In some embodiments, the fourth oxide layer 351 contacts a side wall of the fifth oxide layer 37, and the fourth semiconductor material layer 352 contacts the side wall and a top surface of the fifth oxide layer 37. In some embodiments, the fourth oxide layer 351 may be formed via thermal oxidation technology or other deposition processes. In some embodiments, the fourth semiconductor material layer 352 may be formed via PVD, such as sputtering or spraying. In some embodiments, the fourth semiconductor material layer 352 may be formed via plating or CVD.

Figure 13:
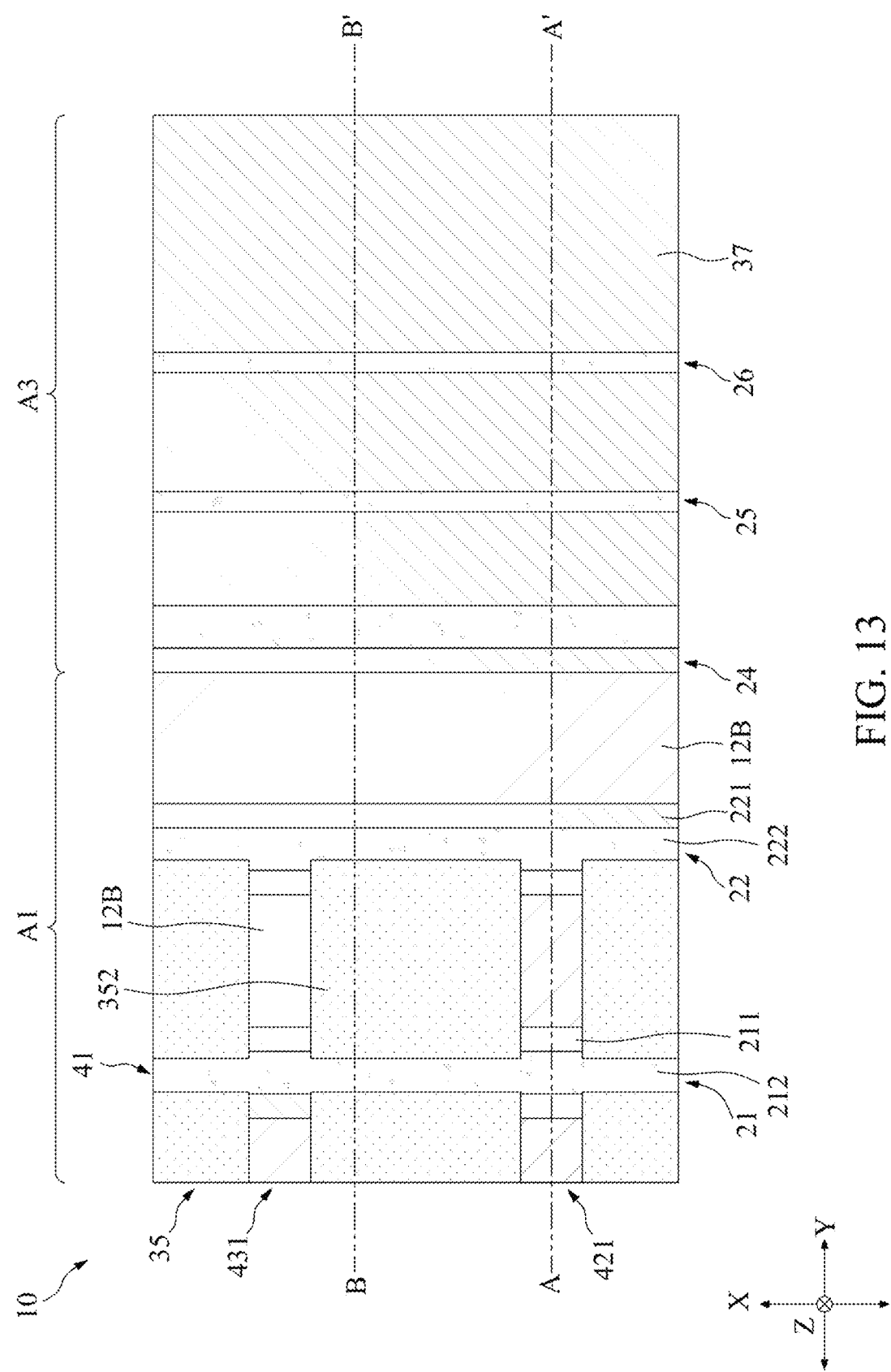
Figure 14:
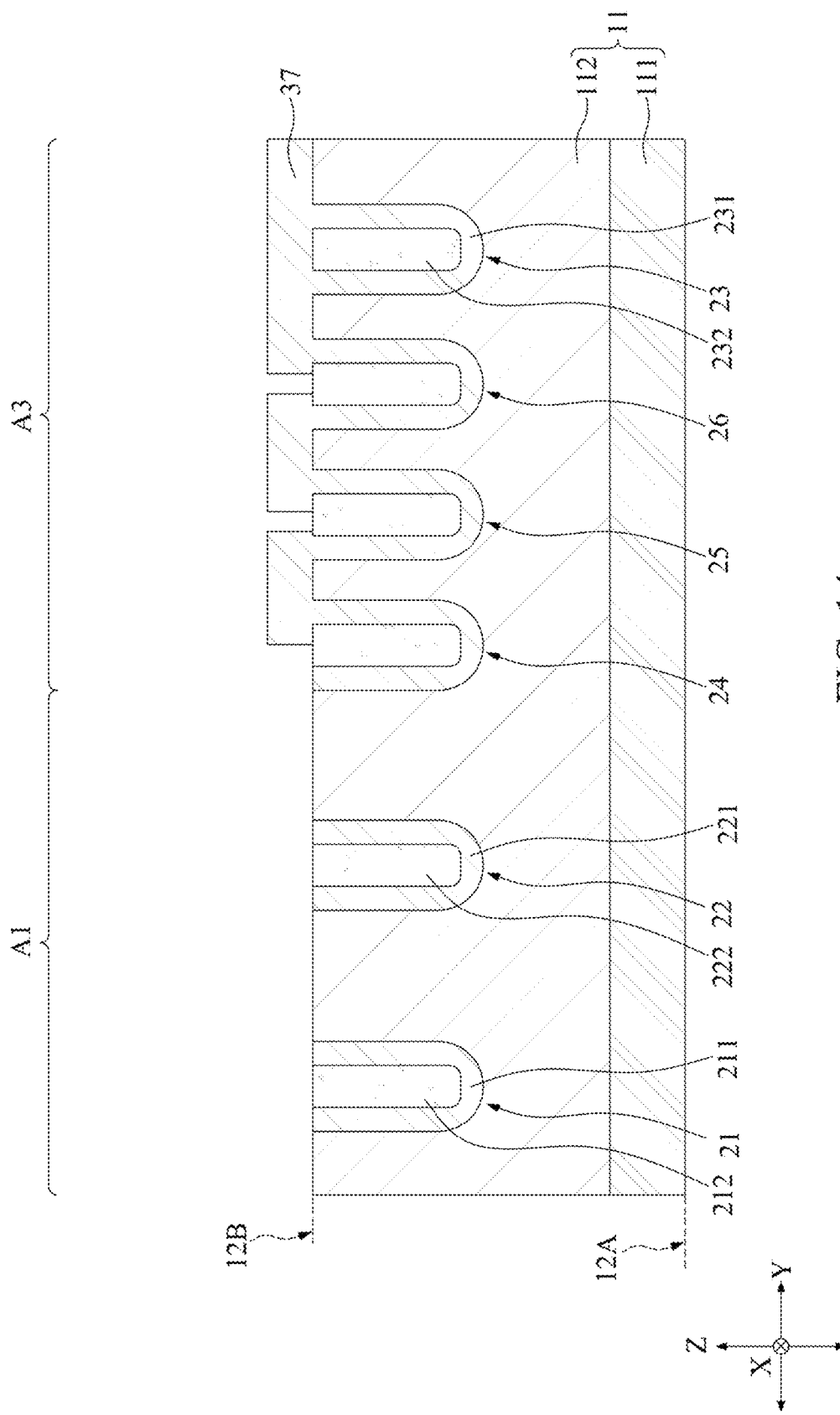
Figure 15:
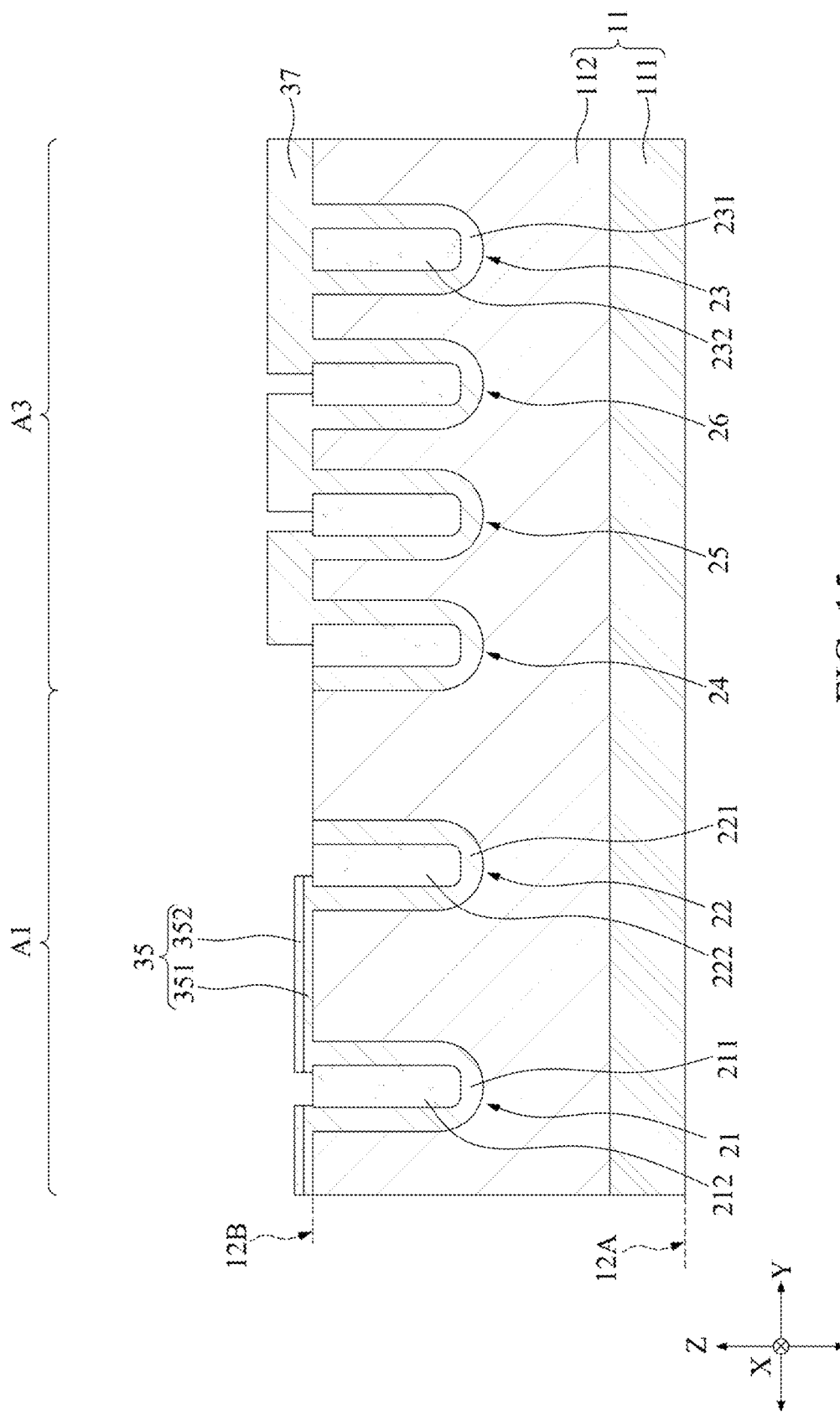
Figure 16:
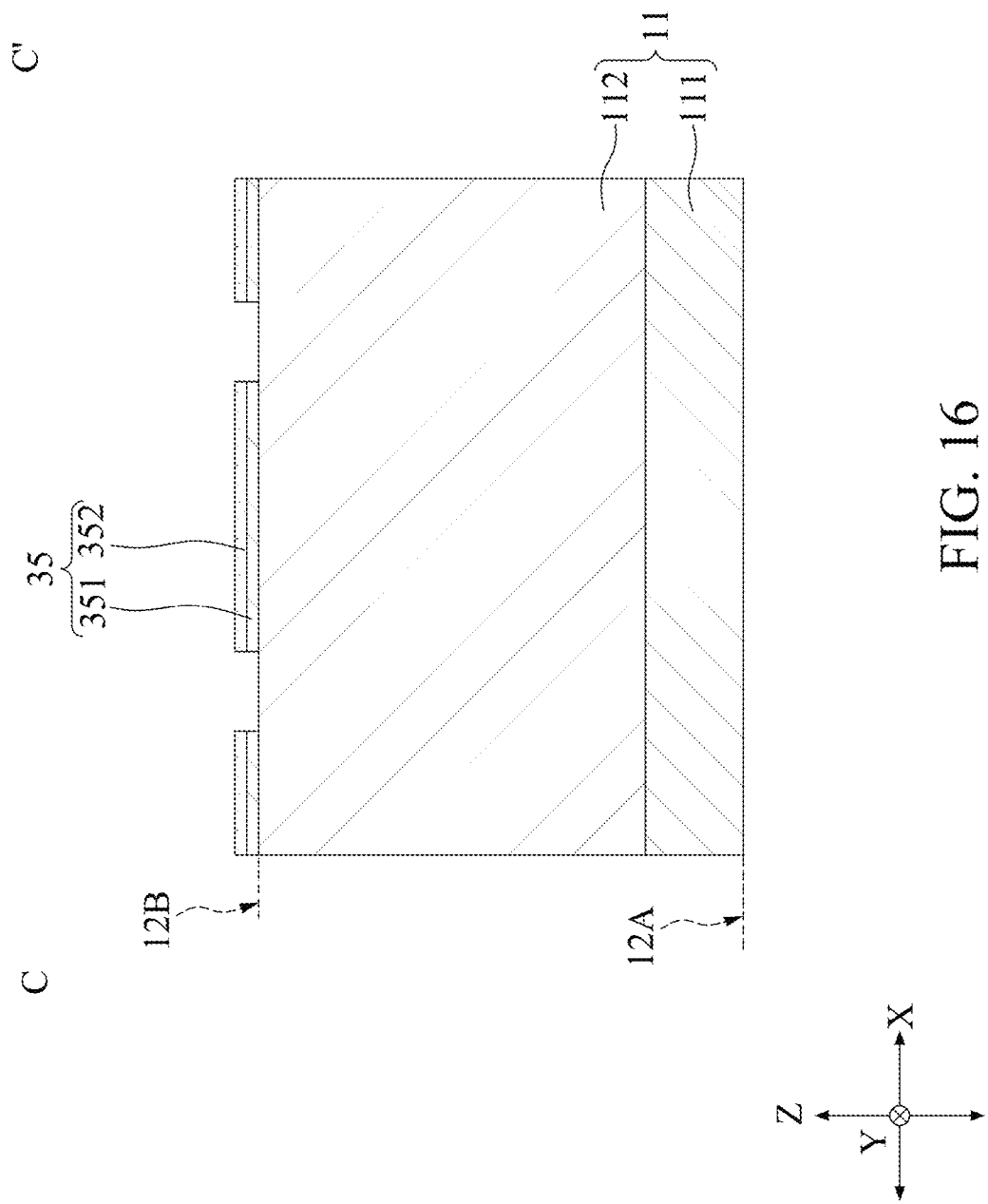

The manufacturing method includes performing an etching process on the mask layer 35 to form a first opening 41, a second opening 42, and a third opening 43. FIG. 13 shows a plan view of a stage in the manufacturing method for the semiconductor structure 10 according to some embodiments of the present case. FIG. 14 shows a cross-sectional view along a cutting line A-A' in the stage shown in FIG. 13 in the manufacturing method for the semiconductor structure according to some embodiments of the present case. FIG. 15 shows a cross-sectional view along a cutting line B-B' in the stage shown in FIG. 12 in the manufacturing method for the semiconductor structure according to some embodiments of the present case. FIG. 16 shows a cross-sectional view along a cutting line C-C' in the stage shown in FIG. 13 in the manufacturing method for the semiconductor structure according to some embodiments of the present case.

Referring to FIG. 13 to FIG. 16, the manufacturing method includes performing a first etching process on the mask layer 35 to form the first opening 41 extending in the first direction X such that at least part of the first semiconductor material layer 212 is exposed, and to form an opening 421 and an opening 431 spaced apart from each other and extending in a second direction Y perpendicular to the first direction such that at least part of the second surface 12B and the first trench structure 21 are exposed. The first etching process further includes removing part of the fourth oxide layer 351 and part of the fourth semiconductor material layer 352, so that the mask layer 35 is provided only on the cell region A1, the first trench structure 21, and the second trench structure 22, but the second surface 12B between the second trench structure 22 and the terminal region A3 is exposed, and the fifth oxide layer 37 is also exposed.

In some embodiments, a patterned mask layer (hereinafter generally referred to as a third mask layer) (not shown in the drawing) is formed on the fourth semiconductor material layer 352. The first opening 41 and the openings 421 and 431 may be positionally defined by the third mask layer, and formed by performing an etching process. The etching process removes the fourth oxide layer 351 and the fourth semiconductor material layer 352, and stops at the second surface 12B or upper surfaces of the first trench structure 21 and the second trench structure 22. According to positions defined by the third mask layer, the first opening 41 covers at least part of the first semiconductor material layer 212, and the openings 421 and 431 may cover the first trench structure 21 and part of the second surface 12B adjacent to the first trench structure 21. In some embodiments, the first opening 41 extends downwards to the top surface of the first semiconductor material layer 212. In some embodiments, the openings 421 and 431 extend downwards to a top surface of the first trench structure 21 and the second surface 12B.

Figure 17:
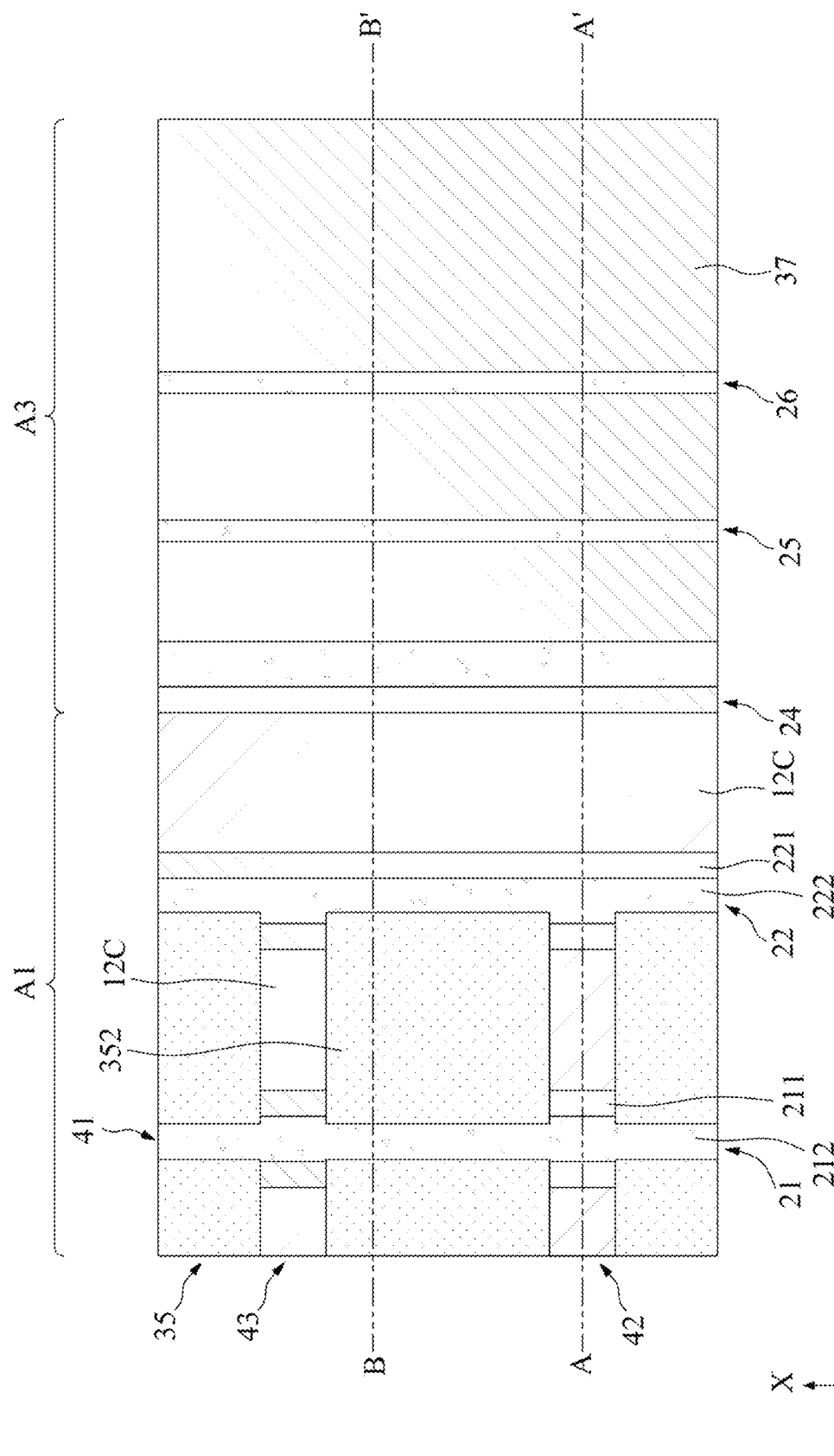
Figure 18:
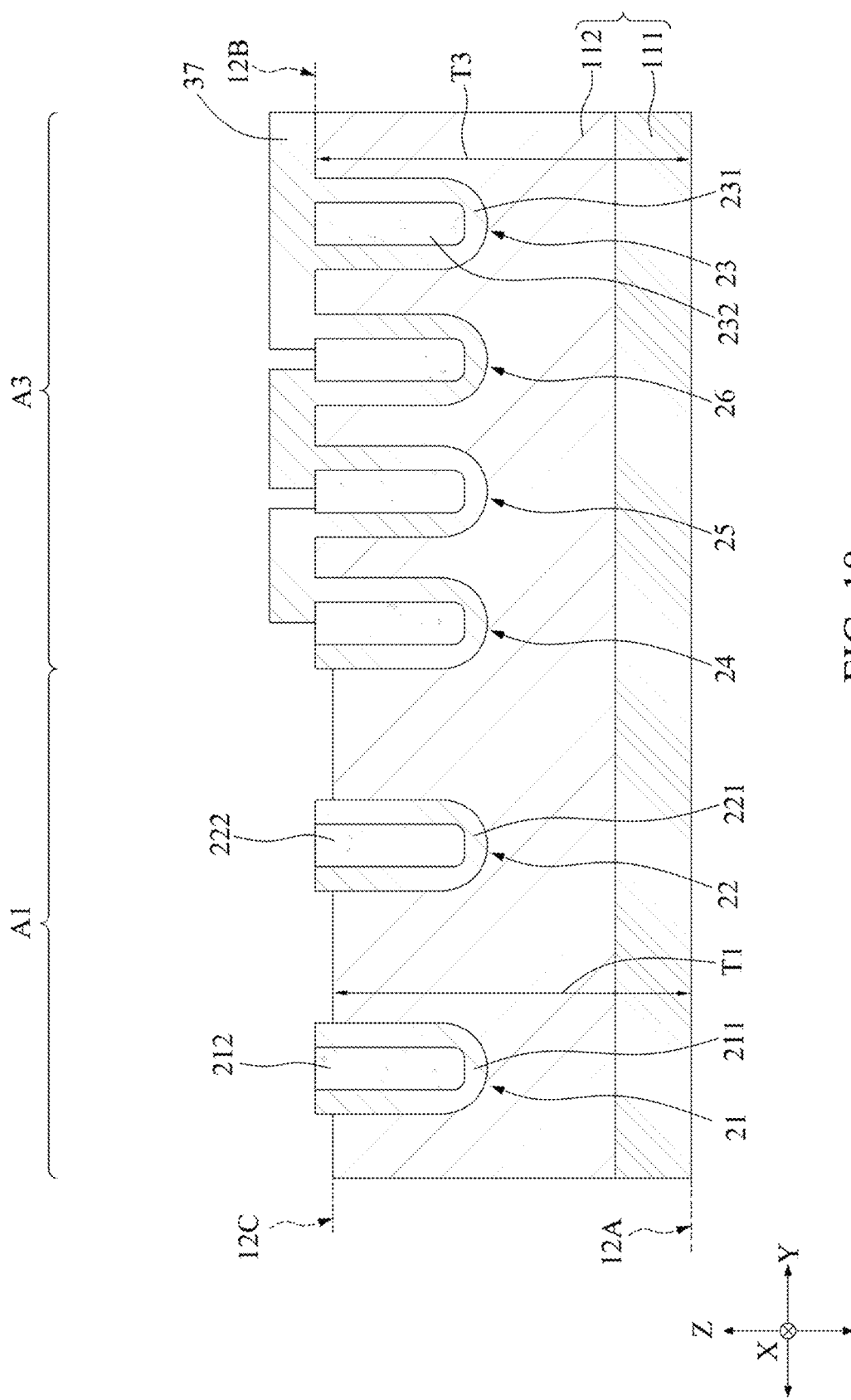
Figure 19:
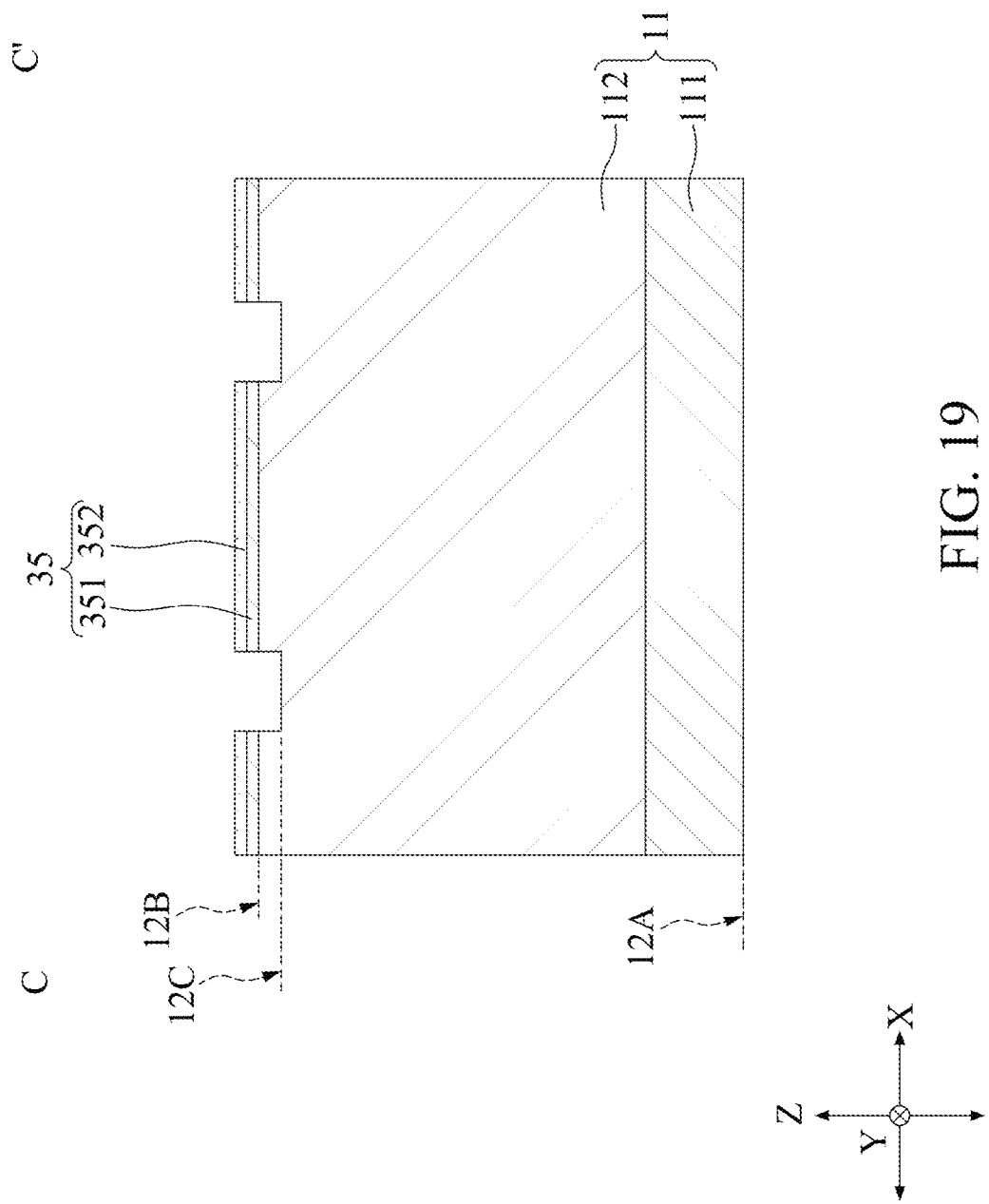

Referring to FIG. 17 to FIG. 19, the manufacturing method includes: after the first etching process, performing a second etching process at the openings 421 and 431, to form a third surface 12C on the substrate 11, and to cause the first trench structure 21 and the second trench structure 22 to at least partially protrude from the third surface 12C of the cell region A1, and to form the second opening 42 and the third opening 43. FIG. 17 shows a plan view of a stage in the manufacturing method for the semiconductor structure according to some embodiments of the present case. FIG. 18 shows a cross-sectional view along the cutting line A-A' in the stage shown in FIG. 17 in the manufacturing method for the semiconductor structure according to some embodiments of the present case. FIG. 19 shows a cross-sectional view along the cutting line C-C' in the stage shown in FIG. 17 in the manufacturing method for the semiconductor structure according to some embodiments of the present case.

The manufacturing method includes: using the mask layer 35 as a mask to locally remove the epitaxial layer 112. In some embodiments, the mask layer 35 and the fifth oxide layer 37 are used as a mask to perform an etching process on the exposed epitaxial layer 112. In some embodiments, the openings 421 and 431 are redefined as the second opening 42 and the third opening 43 by means of the second etching process. In some embodiments, side walls of the second opening 42 and the third opening 43 include the mask layer 35 and part of the epitaxial layer 112. In some embodiments, the bottoms of the openings 421 and 431 in FIG. 12 are higher than or approximately equal to the level heights of the bottoms of the second opening 42 and the third opening 43 in FIG. 16. In some embodiments, the depths of the second opening 42 and the third opening 43 are greater than the depths of the openings 421 and 431.

After the second etching process, the substrate 11 has a first thickness T1 in the cell region A1, and has a second thickness T3 in the terminal region A3, and the second thickness T3 is greater than the first thickness T1. In some embodiments, the level height of the fifth oxide layer 37 is higher than the level height of the mask layer 35, and the height level of the mask layer 35 is higher than the height level of the third surface 12C.

Figure 20:
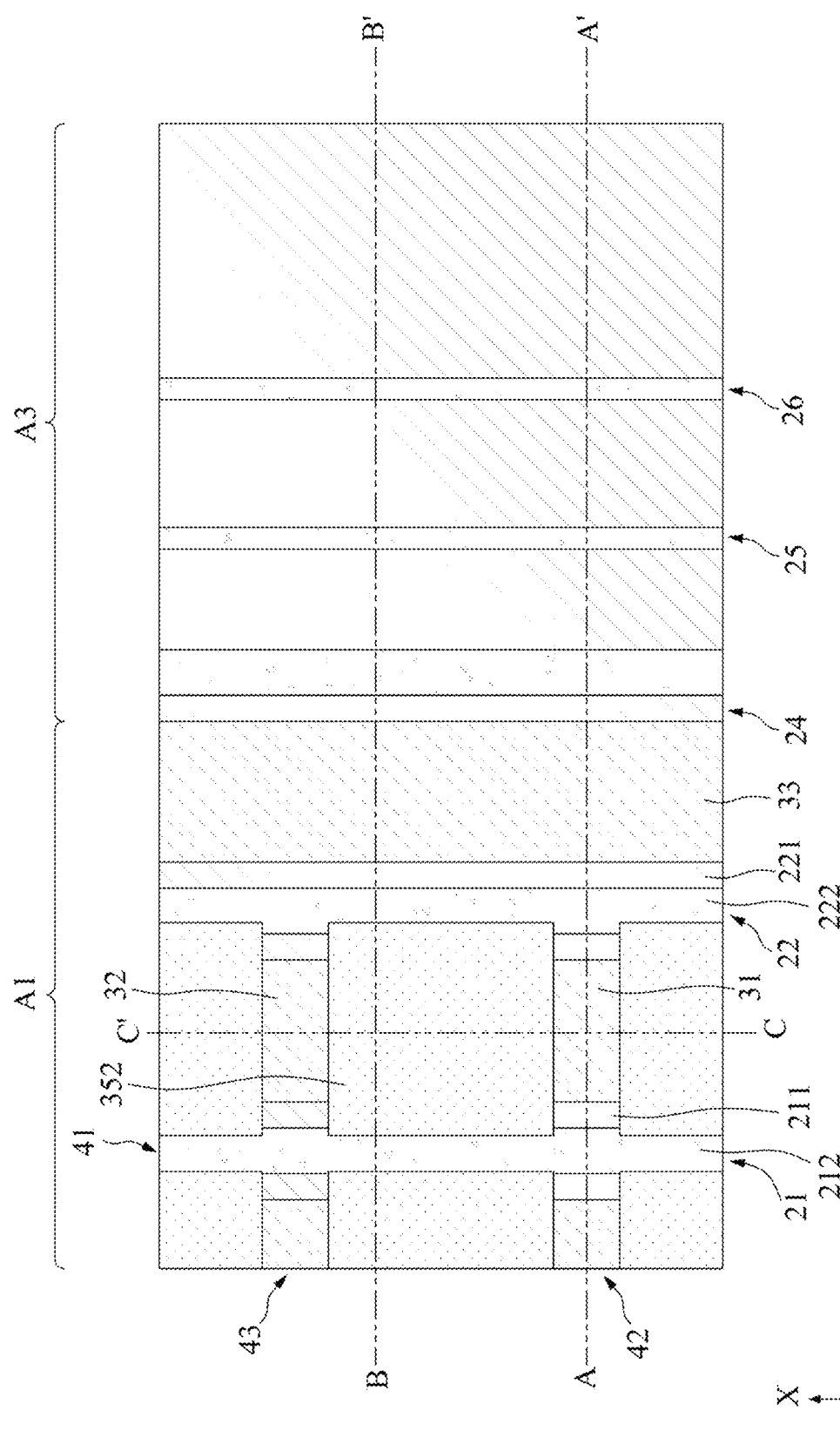
Figure 21:
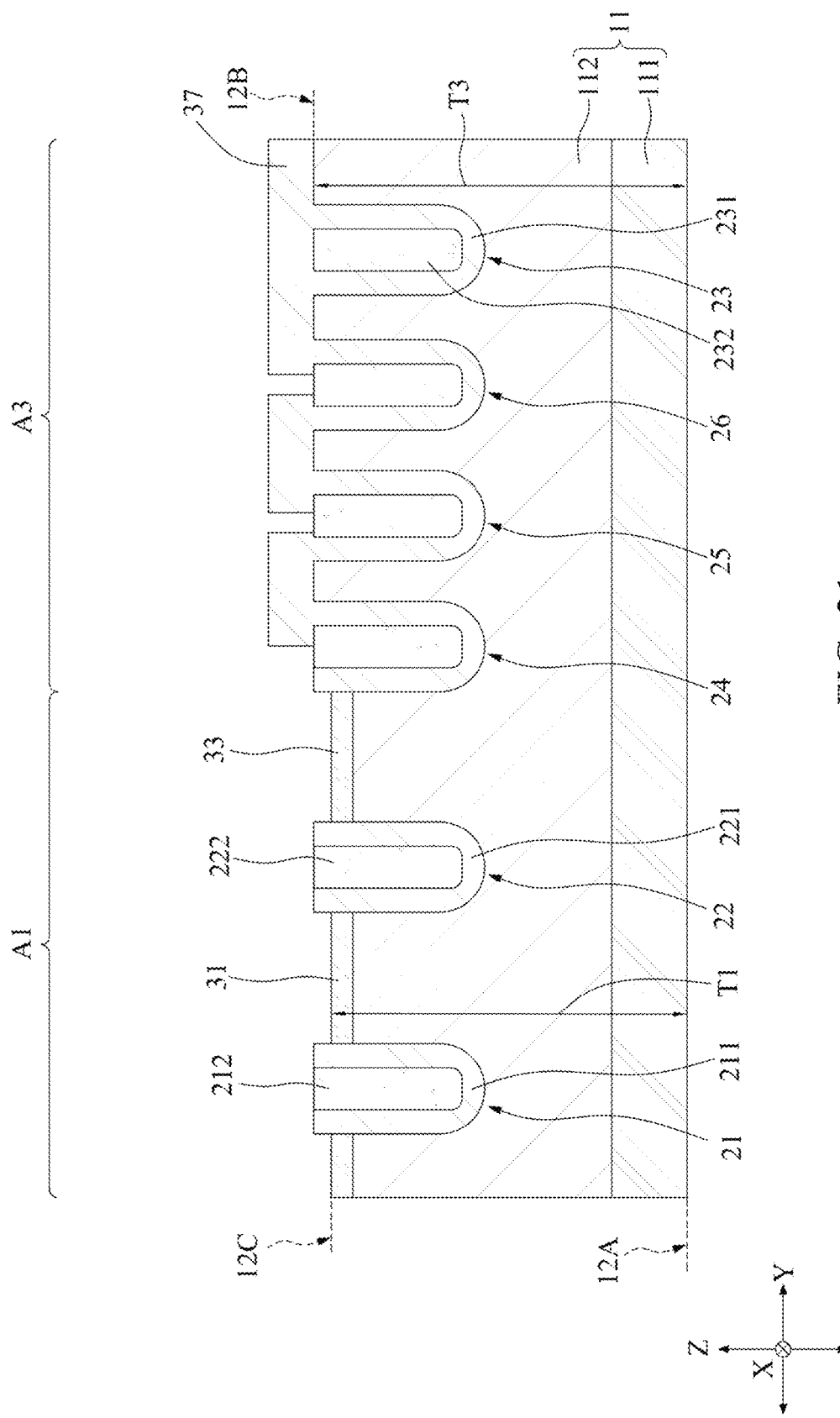
Figure 22:
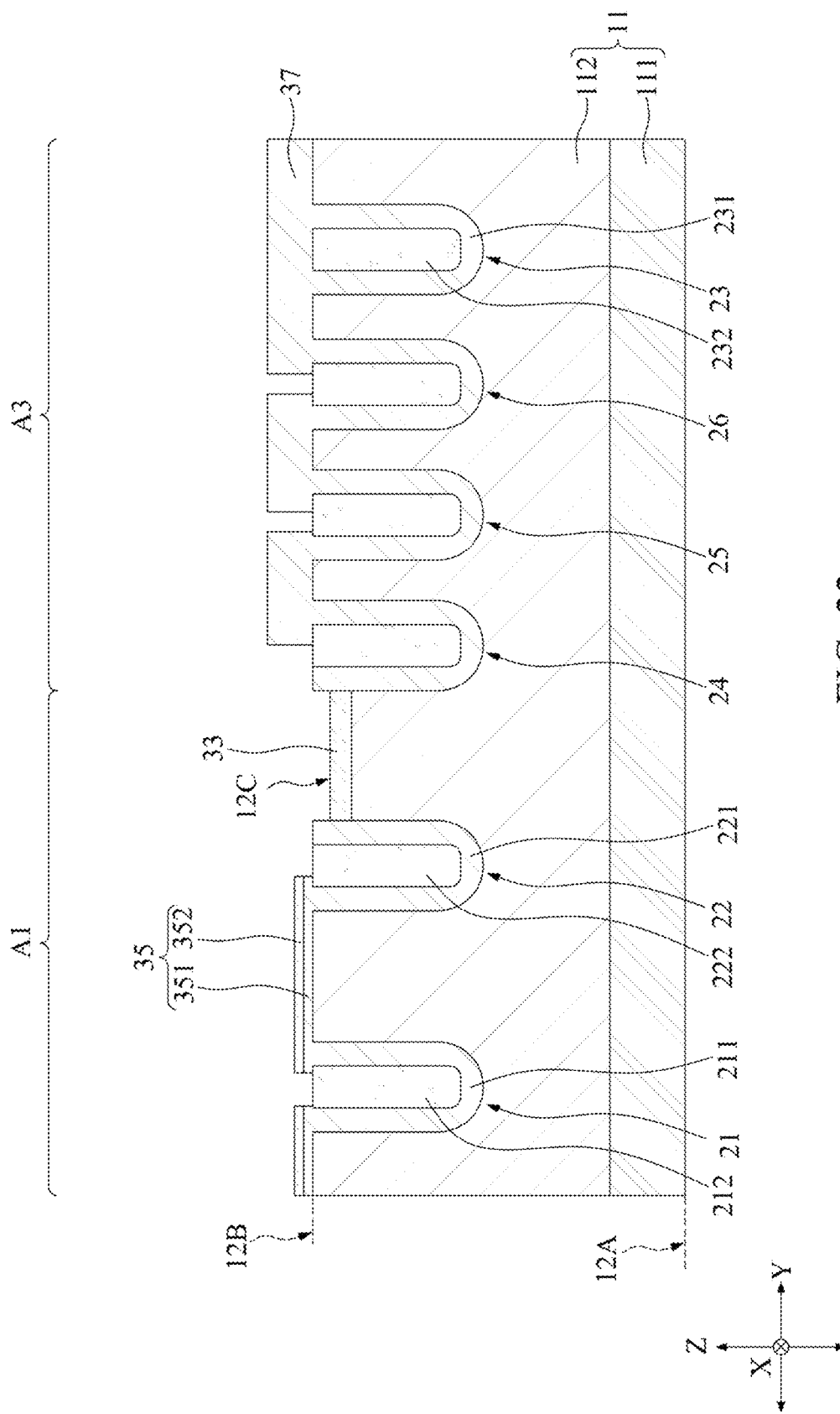

Referring to FIGS. 20 to 22, the manufacturing method includes: forming a first doped region 31 at the third surface 12C exposed by the second opening 42, and forming a second doped region 32 at the third surface 12C exposed by the third opening 43. When seen in a plan view, the first doped region 31 and the second doped region 32 are respectively provided between the first trench structure 21 and the second trench structure 22, and extend in the second direction Y. The manufacturing method further includes forming a third doped region 33 between the cell region A1 and the terminal region A3. The first doped region 31 is separated from the third doped region 33. When seen in a plan view, the second trench structure 22 is located between the first doped region 31 and the third doped region 33. FIG. 19 shows a plan view of a stage in the manufacturing method for the semiconductor structure according to some embodiments of the present case. FIG. 20 shows a cross-sectional view along the cutting line A-A' in the stage shown in FIG. 18 in the manufacturing method for the semiconductor structure according to some embodiments of the present case. FIG. 21 shows a cross-sectional view along the cutting line B-B' in the stage shown in FIG. 19 in the manufacturing method for the semiconductor structure according to some embodiments of the present case.

The first doped region 31, the second doped region 32, and the third doped region 33 may be formed by performing diffusion or an ion implantation process from the third surface 12C. After the first doped region 31, the second doped region 32, and the third doped region 33 are formed, the first trench structure 21 and the second trench structure 22 at least partially protrude from the first doped region 31, the second doped region 32, and the third doped region 33.

The depths of the first doped region 31, the second doped region 32, and the third doped region 33 are less than the depths of the first trench structure 21 and the second trench structure 22. In other words, the bottoms of the first doped region 31, the second doped region 32, and the third doped region 33 are higher than the bottoms of the first trench structure 21 and the second trench structure 22. In some embodiments, coverage of the first doped region 31, the second doped region 32, and the third doped region 33 is defined in the cell region A1, and is part of the epitaxial layer 112 excluding the mask layer 35, the first trench structure 21, and the second trench structure 22. In some embodiments, an annealing process is performed after the ion implantation process to diffuse doping ions. In some embodiments, the doping ions are, for example, boron ions, aluminum ions, gallium ions, indium ions, or the like. In some embodiments, boron ions are implanted into the first doped region 31, the second doped region 32, and the third doped region 33.

In some embodiments, a patterned mask layer (hereinafter generally referred to as the third mask layer) is formed on the mask layer 35 and the fifth oxide layer 37 to define the positions of the first doped region 31, the second doped region 32, and the third doped region 33, and the conductivity types and the depths of the first doped region 31, the second doped region 32, and the third doped region 33 are defined by adjusting the introduced ions, energy, and amount of the diffusion or ion implantation process. Ions are implanted into the third surface 12C in a vertical direction Z. In some embodiments, the third mask layer is formed after a photolithographic process using a photomask having a corresponding pattern. In some embodiments, the first doped region 31, the second doped region 32, and the third doped region 33 are formed separately, and each ion implantation process performed on the third surface 12C is followed by one annealing process to diffuse the doping ions.

Figure 23:
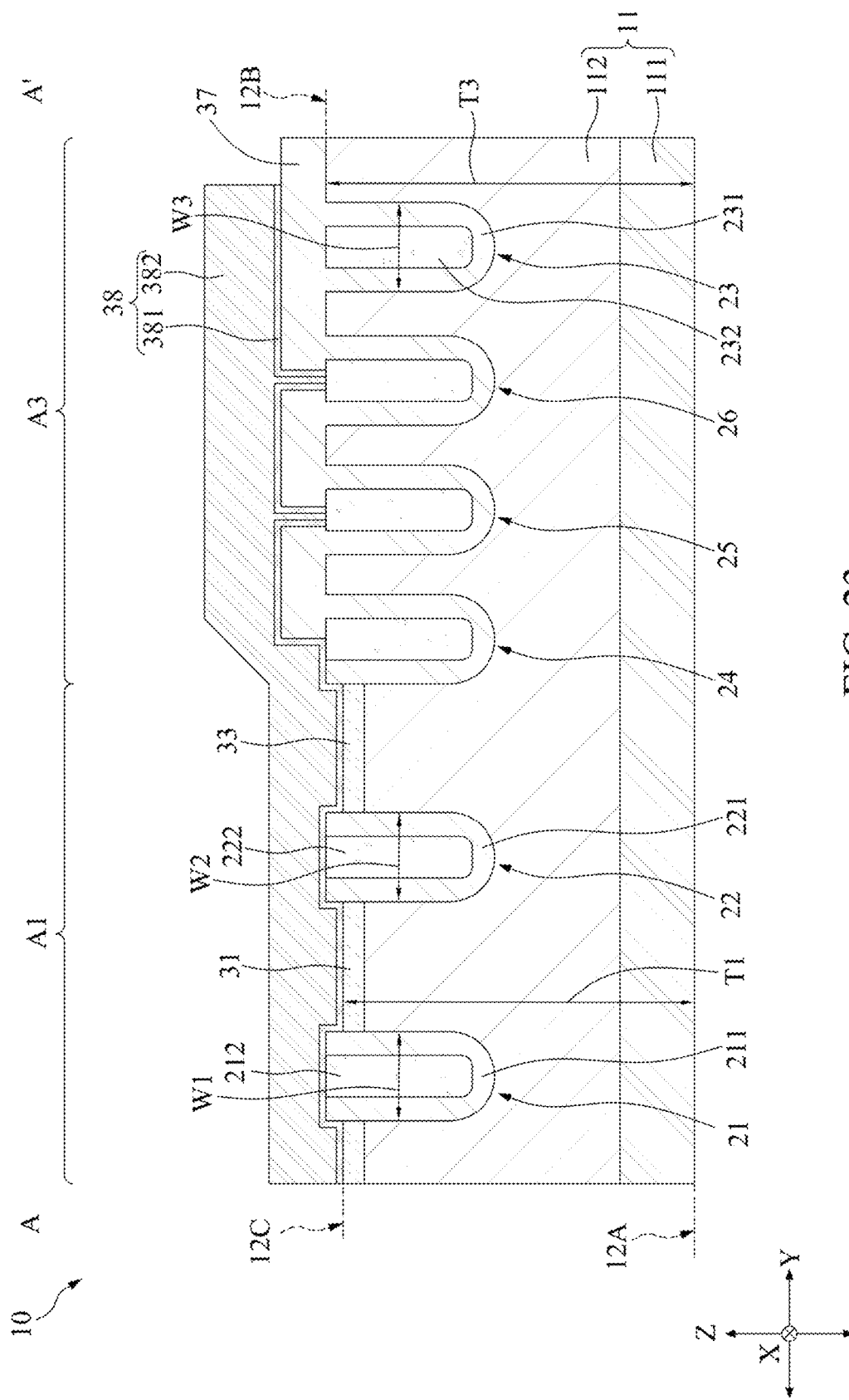
Figure 24:
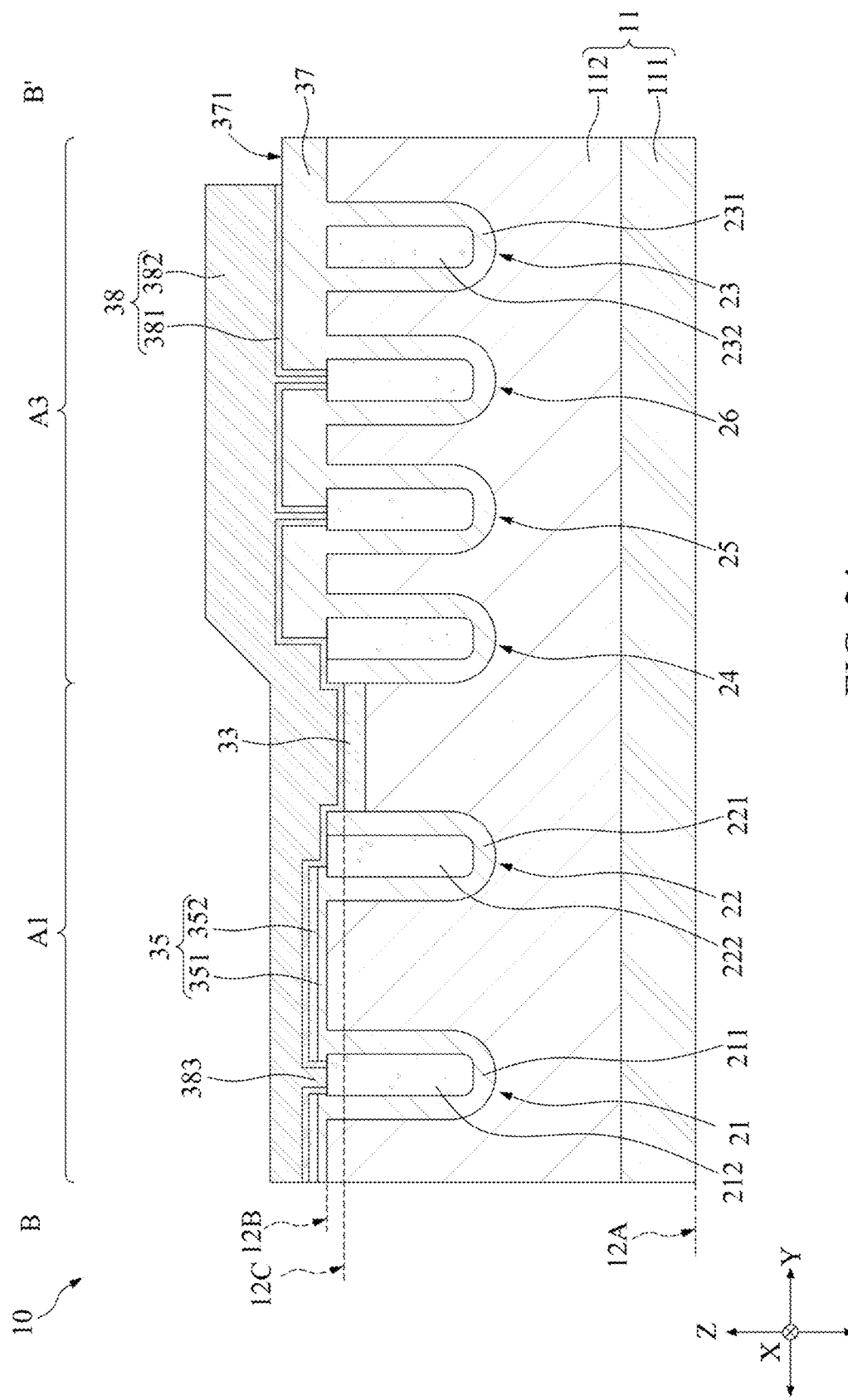
Figure 25:
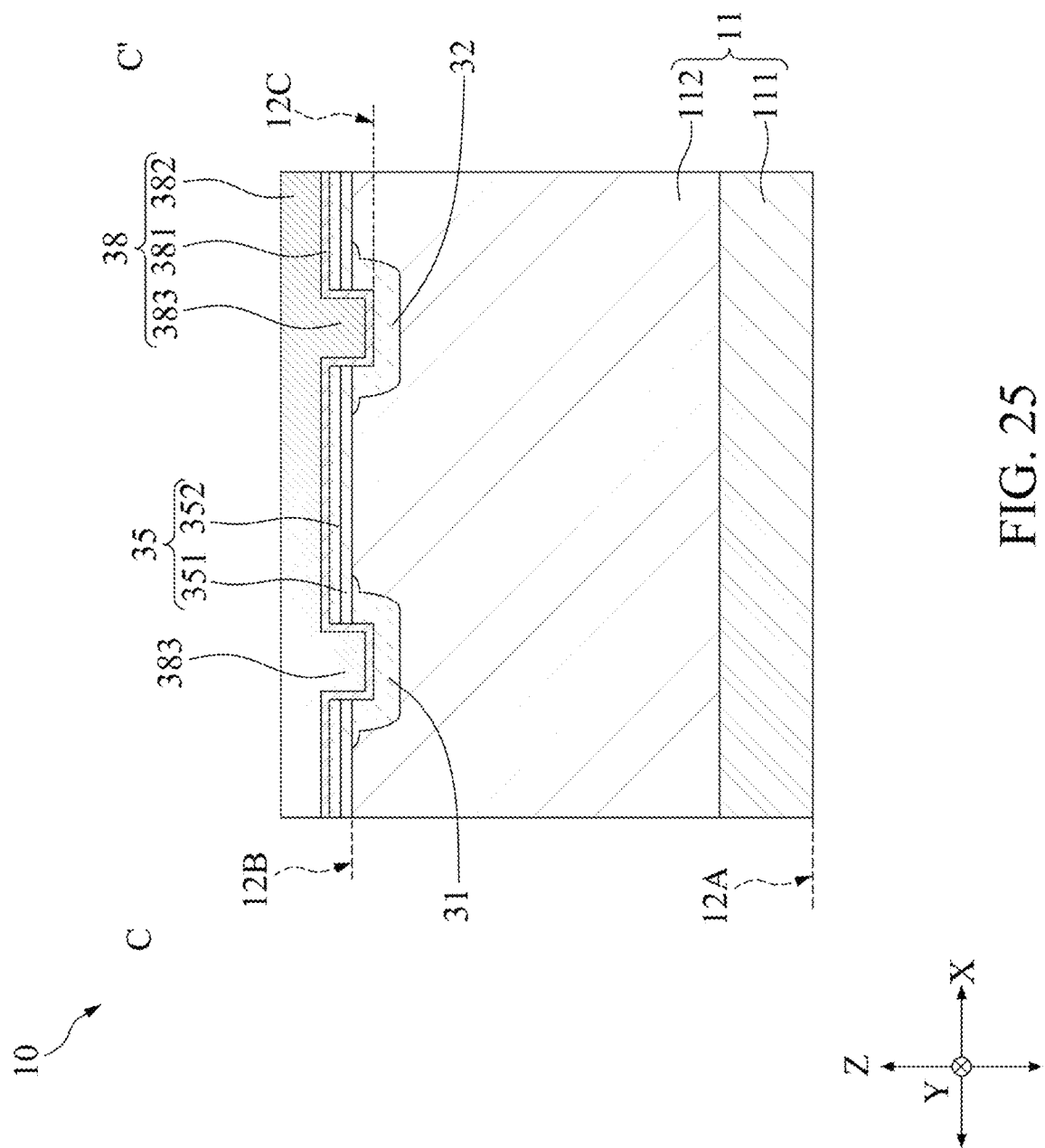

Referring to FIGS. 23 to 25, the manufacturing method includes forming a conductive layer 38 on the first semiconductor material layer 212, the second semiconductor material layer 222, and the third semiconductor material layer 232. The conductive layer 38 may be formed by means of plating or CVD. The material of the conductive layer 38 may include copper (Cu), gold (Au), silver (Ag), aluminum (Al), nickel (Ni), titanium (Ti), tungsten (W), tin (Sn), titanium nitride (TiN), an aluminum-silicon alloy (AlSi) alloy, an aluminum-silicon-copper (AlSiCu) alloy, or another metal or alloy. The first trench structure 21 and the second trench structure 22 are electrically connected to the conductive layer 38. In some embodiments, the manufacturing method includes: further removing part of the conductive layer 38 at an edge of the terminal region A3, so that an edge 371 of the fifth oxide layer 37 is exposed from the conductive layer 38.

The manufacturing method includes forming a first conductive layer 381 on the mask layer 35, the third surface 12C, and the fifth oxide layer 37. The first conductive layer 381 extends along a side wall of the mask layer 35, and contacts the first semiconductor material layer 212 and the second semiconductor material layer 222. In some embodiments, the first conductive layer 381 includes titanium (Ti).

The manufacturing method includes: forming a second conductive layer 382 provided on the first conductive layer 381, extending along a side wall of the first conductive layer 381, and contacting the first semiconductor material layer 212 and the second semiconductor material layer 222. In some embodiments, the second conductive layer 382 includes titanium nitride (TiN).

The semiconductor structure 10 formed via the above steps may be substantially the same as the semiconductor structure 10 shown in FIG. 1 to FIG. 4. The semiconductor structure 10 has the first doped region 31 and the second doped region 32 provided between the first trench structure 21 and the second trench structure 22, and the first doped region 31 and the second doped region 32 are spaced apart from each other and extend in the second direction Y parallel to the third surface 12C and perpendicular to the first direction X, thereby achieving the effect of increasing channel density.

According to the described structure and process of the present disclosure, and given the same purpose and concept, the steps in the aforementioned process can be adjusted or exchanged in sequence so as to achieve the same or similar semiconductor structures.

Herein, for convenience of description, spatially relative terms such as "below," "under," "lower," "above," "upper," "left side," and "right side" may be used to describe the relationship between one component or feature and another or more components or features as shown in the accompanying drawings. In addition to the orientation depicted in the accompanying drawings, the spatially relative terms may be intended to encompass different orientations of a device in use or operation. The apparatus may be otherwise oriented (by rotating 90 degrees or at other orientations) and similarly, spatially relative descriptors used herein may be interpreted in a corresponding manner. It should be understood that when a component is referred to as "connected to" or "coupled to" another component, it may be directly connected to or coupled to another component, or an intermediate component may be present.

As used herein, the terms "approximately," "substantially," "essentially," and "about" are used to describe and interpret small variations. When used in conjunction with an event or circumstance, the terms can refer to instances where the event or circumstance occurs exactly as well as instances where the event or circumstance occurs nearly. As used herein with respect to a given value or range, the term "about" refers generally to within ±10%, ±5%, ±1%, or ±0.5% of a given value or range. Ranges may be expressed herein as one endpoint to another endpoint or between two endpoints. All ranges disclosed herein include endpoints unless otherwise specified. The term "substantially coplanar" may refer to the difference in position of two surfaces located along the same plane being within several microns (μm), such as a position difference located along the same plane being within 10 μm, 5 μm, 1 μm, or 0.5 μm. When values or properties are referred to as being "substantially" identical, the term may refer to values that are within ±10%, ±5%, ±1%, or ±0.5% of the mean value of the stated values. The foregoing summarizes the features of several embodiments and the detailed aspects of the present disclosure. The embodiments described in the present disclosure may be readily used as a basis for designing or modifying other processes and structures to facilitate implementation of the same or similar purpose and/or achieve the same or similar advantages of the embodiments introduced herein. Such equivalents are not departing from the spirit and scope of the present disclosure, and various changes, replacements and alterations may be made without departing from the spirit and scope of the present disclosure.

What is claimed is:

1. A manufacturing method for a semiconductor structure, the method comprising:

forming on a substrate, at intervals in a first direction, a first trench, a second trench, and a third trench extending from a second surface towards a first surface opposite the second surface, wherein a cell region and a terminal region seen in a plan view are defined on the substrate, the first trench and the second trench being provided in the cell region, and the third trench being provided in the terminal region;

forming a first oxide layer in the first trench, forming a second oxide layer in the second trench, and forming a third oxide layer in the third trench;

forming a first semiconductor material layer in the first trench to cause the first semiconductor material layer to be surrounded by the first oxide layer to form a first trench structure, forming a second semiconductor material layer in the second trench to cause the second semiconductor material layer to be surrounded by the second oxide layer to form a second trench structure, and forming a third semiconductor material layer in the third trench to cause the third semiconductor material layer to be surrounded by the third oxide layer to form a third trench structure;

forming a mask layer on the cell region, the first trench structure, and the second trench structure;

performing a first etching process on the mask layer to form a first opening and a second opening, the first opening extending in the first direction such that at least part of the first semiconductor material layer is exposed, and the second opening extending in a second direction perpendicular to the first direction such that at least part of the second surface and the first trench structure are exposed;

after the first etching process, performing a second etching process at the second opening to form a third surface on the substrate and to cause the first trench structure and the second trench structure to at least partially protrude from the third surface of the cell region; and forming a first doped region adjacent to the third surface exposed by the second opening, wherein when seen in a plan view, the first doped region is provided between the first trench structure and the second trench structure, and extends in the second direction.

2. The manufacturing method according to claim 1, wherein forming the first semiconductor material layer, the second semiconductor material layer, and the third semiconductor material layer further comprises:

placing a first semiconductor material in the first trench such that a top surface of the first semiconductor material and a top surface of the first oxide layer are substantially coplanar, placing a second semiconductor material in the second trench such that a top surface of the second semiconductor material and a top surface of the second oxide layer are coplanar, and placing a third semiconductor material in the third trench such that a top surface of the third semiconductor material and a top surface of the third oxide layer are substantially coplanar; and performing a third etching process to remove at least part of the first semiconductor material in the first trench, at least part of the second semiconductor material in the second trench, and at least part of the third semiconductor material in the third trench;

wherein after the third etching process, a top surface of the first semiconductor material layer, a top surface of the second semiconductor material layer, and a top surface of the third semiconductor material layer are substantially coplanar with the second surface of the substrate.

3. The manufacturing method according to claim 1, wherein after the second etching process, the substrate has a first thickness in the cell region and a second thickness in the terminal region, and the second thickness is greater than the first thickness.

4. The manufacturing method according to claim 1, further comprising forming a second doped region between the cell region and the terminal region, wherein the first doped region is separated from the second doped region, and when seen in a plan view, the second trench structure is located between the first doped region and the second doped region.

5. The manufacturing method according to claim 1, wherein the first oxide layer, the second oxide layer, and the third oxide layer are formed simultaneously.

6. The manufacturing method according to claim 1, further comprising forming a conductive layer on the first semiconductor material layer, the second semiconductor material layer, and the third semiconductor material layer, wherein the first trench structure and the second trench structure are electrically connected to the conductive layer.

7. The manufacturing method according to claim 1, wherein forming the first doped region comprises implanting ions adjacent to the third surface exposed by the second opening.

\* \* \* \* \*